(12) United States Patent
Chong et al.

(10) Patent No.: US 7,231,536 B1
(45) Date of Patent: Jun. 12, 2007

(54) CONTROL CIRCUIT FOR SELF-COMPENSATING DELAY CHAIN FOR MULTIPLE-DATA-RATE INTERFACES

(75) Inventors: Yan Chong, Mountain View, CA (US); Chiakang Sung, Milpitas, CA (US); Joseph Huang, San Jose, CA (US); Philip Pan, Fremont, CA (US)

(73) Assignee: Altera Corporation, San Jose, CA (US)

( * ) Notice: Subject to any disclaimer, the term of this patent is extended or adjusted under 35 U.S.C. 154(b) by 201 days.

(21) Appl. No.: 10/799,408

(22) Filed: Mar. 12, 2004

Related U.S. Application Data

(63) Continuation-in-part of application No. 10/037,861, filed on Jan. 2, 2002.

(60) Provisional application No. 60/315,985, filed on Aug. 29, 2001, provisional application No. 60/315,876, filed on Aug. 29, 2001.

(51) Int. Cl.
  *G06F 1/12* (2006.01)
  *G06F 13/42* (2006.01)
  *G06F 1/04* (2006.01)

(52) U.S. Cl. .................. 713/400; 713/401; 713/503

(58) Field of Classification Search .............. None
See application file for complete search history.

(56) References Cited

U.S. PATENT DOCUMENTS

| | | |
|---|---|---|
| 5,223,755 A | 6/1993 | Richley |
| 5,555,214 A | 9/1996 | Sung et al. |
| 5,604,775 A * | 2/1997 | Saitoh et al. ............... 375/376 |
| 5,633,830 A | 5/1997 | Sung et al. |
| 5,764,080 A | 6/1998 | Huang et al. |
| 5,802,540 A | 9/1998 | Sung et al. |
| 5,828,229 A | 10/1998 | Cliff et al. |
| 5,970,255 A | 10/1999 | Tran et al. |

(Continued)

OTHER PUBLICATIONS

Michael B. Bendak et al., "CMOS VLSI Implementation of Gigabyte/Second Computer Network Links", IEEE, 1996, pp. 269-272.

(Continued)

*Primary Examiner*—Rehana Perveen
*Assistant Examiner*—Stefan Stoynov
(74) *Attorney, Agent, or Firm*—Townsend and Townsend and Crew LLP; J. Matthew Zigmant

(57) ABSTRACT

Circuits, methods, and apparatus that prevent control signals from changing state while the control signals are being used to delay a read strobe signal. An exemplary embodiment of the present invention provides a control circuit that provides a plurality of control bits to a delay line, where the delay line delays or phase shifts a read strobe signal a duration, where the duration depends on the state of the control bits. The delayed read strobe signal is used to clock one or more data registers. To avoid undesired changes in the duration that the read strobe signal is delayed, the control bits are retimed before being provided to the delay line. A specific embodiment waits for an edge of the strobe signal to be output by the delay line before providing the control bits to the delay line. Another specific embodiment waits until no edge of the strobe signal is being delayed by the delay line before providing the control bits to the delay line.

16 Claims, 23 Drawing Sheets

U.S. PATENT DOCUMENTS

| | | | |
|---|---|---|---|
| 5,978,281 A | 11/1999 | Anand et al. | |
| 6,002,282 A | 12/1999 | Alfke | |
| 6,011,744 A | 1/2000 | Sample et al. | |
| 6,044,122 A | 3/2000 | Ellersick et al. | |
| 6,049,255 A | 4/2000 | Hagberg et al. | |
| 6,061,292 A | 5/2000 | Su et al. | |
| 6,100,713 A | 8/2000 | Kalb et al. | |
| 6,128,692 A | 10/2000 | Sung et al. | |
| 6,140,854 A | 10/2000 | Coddington et al. | |
| 6,147,520 A | 11/2000 | Kothandaraman et al. | |
| 6,150,863 A | 11/2000 | Conn et al. | |
| 6,157,690 A | 12/2000 | Yoneda | |
| 6,178,212 B1 | 1/2001 | Akashi | |
| 6,212,113 B1 | 4/2001 | Maeda | |
| 6,212,127 B1 | 4/2001 | Funaba et al. | |
| 6,236,231 B1 | 5/2001 | Nguyen et al. | |
| 6,252,419 B1 | 6/2001 | Sung et al. | |
| 6,269,051 B1 | 7/2001 | Funaba et al. | |
| 6,279,073 B1 | 8/2001 | McCracken et al. | |
| 6,295,245 B1 | 9/2001 | Tomita et al. | |
| 6,316,980 B1 * | 11/2001 | Vogt et al. | 327/273 |
| 6,342,796 B2 | 1/2002 | Jung | |
| 6,346,843 B2 | 2/2002 | Takahashi | |
| 6,351,165 B1 | 2/2002 | Gregorian et al. | |
| 6,351,166 B2 | 2/2002 | Hashimoto | |
| 6,356,509 B1 | 3/2002 | Abdel-Hafeez et al. | |
| 6,400,197 B2 | 6/2002 | Lai et al. | |
| 6,442,102 B1 | 8/2002 | Borkenhagen et al. | |
| 6,445,642 B2 | 9/2002 | Murakami et al. | |
| 6,466,491 B2 | 10/2002 | Yanagawa | |
| 6,472,904 B2 | 10/2002 | Andrews et al. | |
| 6,492,852 B2 | 12/2002 | Fiscus | |
| 6,504,790 B1 | 1/2003 | Wolford | |
| 6,509,776 B2 | 1/2003 | Kobayashi et al. | |
| 6,518,812 B1 | 2/2003 | Sikkink et al. | |
| 6,525,565 B2 | 2/2003 | Young et al. | |
| 6,525,585 B1 | 2/2003 | Lida et al. | |
| 6,570,944 B2 | 5/2003 | Best et al. | |
| 6,577,694 B1 | 6/2003 | Meghelli | |
| 6,690,201 B1 | 2/2004 | Simking et al. | |
| 6,798,241 B1 | 9/2004 | Bauer et al. | |
| 6,806,733 B1 | 10/2004 | Pan et al. | |
| 6,816,991 B2 | 11/2004 | Sanghani | |
| 6,864,715 B1 | 3/2005 | Bauer et al. | |
| 6,864,710 B1 | 5/2005 | Laccy et al. | |
| 6,894,531 B1 | 5/2005 | Nouban et al. | |
| 6,940,768 B2 | 9/2005 | Dahlberg et al. | |
| 6,946,872 B1 | 9/2005 | Pan et al. | |
| 7,123,051 B1 | 10/2006 | Lee et al. | |
| 7,126,399 B1 | 10/2006 | Lee | |
| 2003/0129861 A1 | 7/2003 | Engelhardt et al. | |
| 2004/0000940 A1 | 1/2004 | Chang | |
| 2005/0025190 A1 | 2/2005 | Frich | |
| 2005/0184776 A1 | 8/2005 | Pilo et al. | |
| 2005/0200390 A1 | 9/2005 | Starr et al. | |

OTHER PUBLICATIONS

"Virtex-II 1.5V Field-Programmable Gate Arrays", XILINX, DS031-2 (v1.5), Apr. 2, 2001, pp. 1-36.

Andrea Boni et al., "LVDS I/O Interface for Gb/s-per-Pin Operation in 0.35-μm CMOS" IEEE Journal of Solid-State Circuits, vol. 36, No. 4, Apr. 2001, pp. 706-711.

"APEX II Programmable Logic Device Family", Altera Corporation, May 2001, pp. 1-8, 38-59.

"APEX 20K Programmable Logic Device Family", Altera Corporation, May 2001, pp. 1-8, 37-47.

* cited by examiner

US 7,231,536 B1

CONTROL CIRCUIT FOR SELF-COMPENSATING DELAY CHAIN FOR MULTIPLE-DATA-RATE INTERFACES

CROSS-REFERENCES TO RELATED APPLICATIONS

This application claims the benefit of U.S. provisional application 60/315,876 filed Aug. 29, 2001, and 60/315,985 filed Aug. 29, 2001, and is a continuation-in-part of U.S. patent application Ser. No. 10/037,861, filed Jan. 2, 2002, all of which are incorporated by reference.

This application is related to commonly-assigned, co-pending U.S. patent application Ser. No. 10/038,737, filed Jan. 2, 2002, which is also incorporated by reference.

BACKGROUND

The present invention relates in general to integrated circuit input/output (I/O) interfaces, and in particular to methods and circuitry for accurately phase shifting clock signals in a multiple-data-rate interface.

Various interfaces have been developed to increase data transfer rates and data throughput between integrated circuits. In a multiple-data-rate interface, two or more bits of data are transferred during each clock period. A specific example is double-data-rate (DDR) technology, which performs two data operations in one clock cycle and achieves twice the data throughput. This technology has enhanced the bandwidth performance of integrated circuits used in a wide array of applications from computers to communication systems. The DDR technique is employed in, for example, synchronous dynamic random access memory (SDRAM) circuits.

DDR interfaces process I/O data (also referred to as DQ signals) using both the rising edge and falling edges of a clock or read strobe signal DQS that functions to control the timing of data transfers. DQS is normally edge-aligned with DQ for a DDR interface operating in read mode (i.e., when receiving data at a memory controller). For optimum data sampling, DQS is delayed by one-quarter of a clock period so that there is a 90 degree phase shift between the edges of DQ and DQS. This ensures that the DQS edge occurs close to the center of the DQ pulse. It is desirable to implement this 90 degree phase shift in a way that is as accurate and as stable as possible. But typical phase shift techniques that use, for example, delay chains, are highly susceptible to process, voltage, temperature, and other variations. In addition, typical DDR timing specifications require a wide frequency range of operation from, e.g., 133 MHz to 200 MHz. This places further demands on the performance of the phase shift circuitry.

Also, this phase shift may be implemented by a delay line, variable delay buffer, or series of delay elements under control of one or more control signals. Glitches, timing errors, or skew between these control signals lead to errors in the phase shift provided to the read strobe signal DQS.

Thus, what is needed are circuits, methods, and apparatus to prevent changes in these control signals from causing errors in the read strobe signal phase shift.

SUMMARY

Accordingly, embodiments of the present invention provide circuits, methods, and apparatus that prevent control signals from changing state when the control signals are being used to delay a read strobe signal.

An exemplary embodiment of the present invention provides a control circuit that provides a plurality of control bits to a delay line, where the delay line delays or phase shifts a read strobe signal a duration, where the duration depends on the state of the control bits. The delayed read strobe signal is used to clock one or more data registers. To avoid undesired changes in the duration that the read strobe signal is delayed, the control bits are retimed before being provided to the delay line. A specific embodiment waits for an edge of the read strobe signal to be output by the delay line before providing the control bits to the delay line. Another specific embodiment waits until no edge of the strobe signal is being delayed by the delay line before providing the control bits to the delay line.

A better understanding of the nature and advantages of the present invention may be gained with reference to the following detailed description and the accompanying drawings.

DESCRIPTION OF EXEMPLARY EMBODIMENTS

Figure 1:
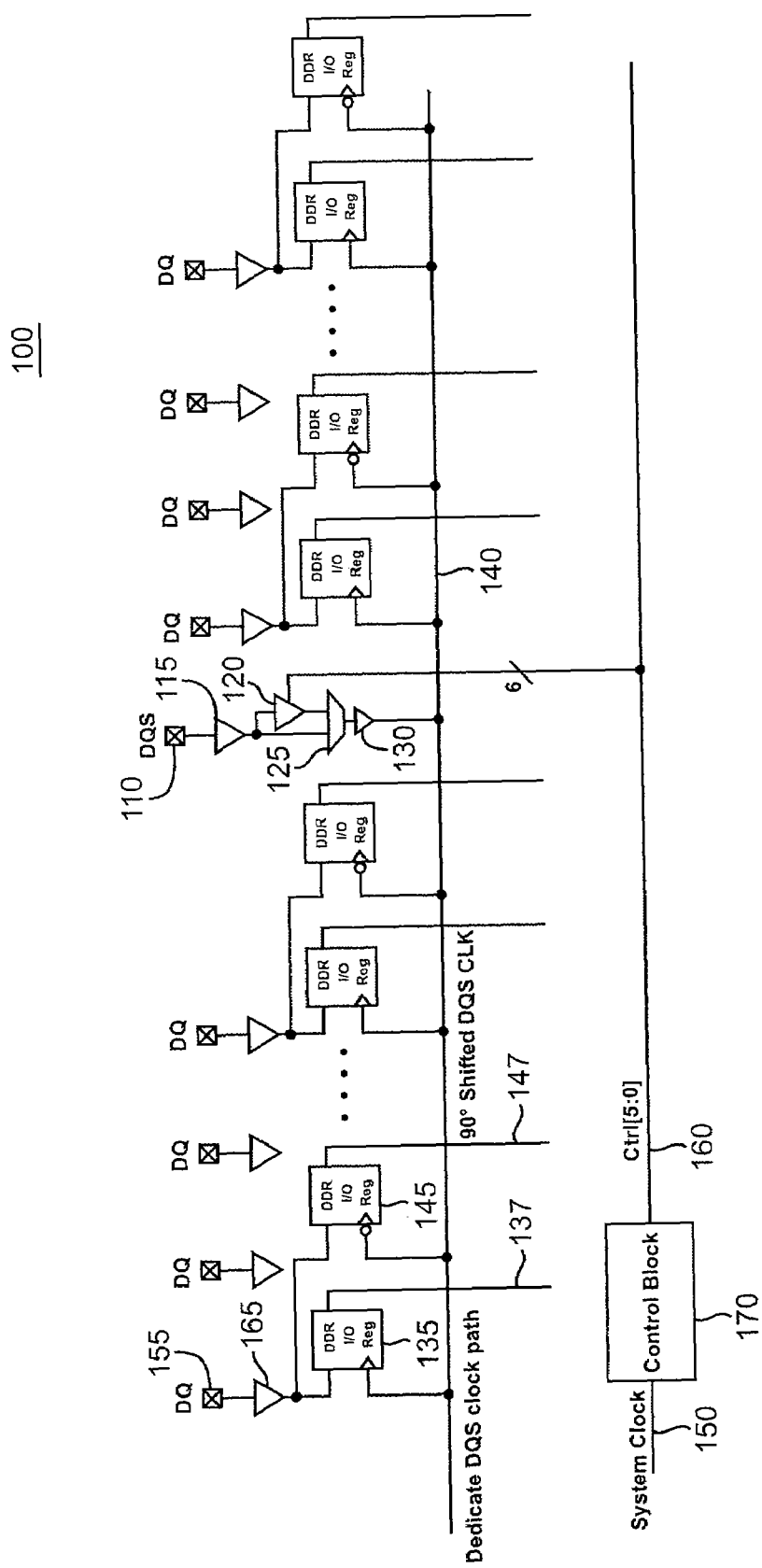
FIG. 1 is a schematic showing a DDR interface consistent with an exemplary embodiment of the present invention.

FIG. 1 is a schematic showing a double-data rate (DDR) interface consistent with an embodiment of the present invention. This figure, as with all the included figures, is shown for illustrative purposes, and does not limit either the possible applications of embodiments of the present invention or the claims. It is further to be understood that embodiments of the present invention are described in the context of a DDR system for illustrative purposes only, and that systems employing higher data rates may also incorporate embodiments of the present invention. The interface shown may be included in an integrated circuit, for example, a programmable logic device.

In the exemplary embodiments shown, there are eight DQ lines 155 for sending and receiving data, and one DQS lines 110 for receiving a clock signal. These lines may be pads that connect to package pins of an integrated circuit. Alternately, they may be internal traces on an integrated circuit. Each DQ line 155 connects to a buffer 165 which in turn is connected to a pair of flip-flops 135 and 145. DQS line 110 connects to buffer 115, which drives a variable-delay buffer 120 and multiplexer 125. Multiplexer 125 selects between the output of buffer 115 or the output of variable-delay buffer 120, and provides an output signal to buffer 130. Multiplexer 123 may be controlled by a bit in a programmable memory by an internal control line, or by other appropriate means. Output buffer 130 in turn drives the clock input of flip-flop 135 and the clock bar input of flip-flop 145. Flip-flops 135 and 145 output data on lines 137 and 147. Line 150 provides a system clock to control block 170, which generates control bits on bus 160 that connects to variable-delay buffer 120. Output lines 137 and 147 may connect to data inputs of a static random-access memory (SRAM) or SDRAM. Alternately, they may connect to other circuitry, such as a first-in first-out (FIFO) or other type of memory, logic, or circuitry.

Typically, the system clock signal on line 150 is continuous. That is, the clock signal alternates or transitions between a first level and a second level generally whenever power is applied to the circuit. This clock signal may be gated or otherwise controlled, for example, it may be enabled by other signals from this or other circuits.

The DQS signal on line 110 is a burst clock that has an undetermined phase relationship with (i.e., is asynchronous to) the system clock on line 150. In a specific embodiment, the DQS signal on line 110 has the same or approximately the same frequency as the system clock on line 150. In other embodiments, one signal may be a harmonic or have a frequency that is a multiple of the other signal's frequency. For example, the DQS signal on line 110 may have a frequency that is twice the frequency (i.e., be the second harmonic) of the system clock on line 150. DQS alternates between a first level and a second level when data is received on lines 155, and is otherwise at a high impedance (i.e., high-z, or tristate) condition. The frequency of the DQS signal may vary over a wide range. For example, a specific embodiment is designed to receive input clock signals at 133 MHz, 166 MHz, or 200 MHz. In the DDR embodiment, data applied at the DQ lines 155 have a data rate that is twice the clock frequency. In this way, data at the DQ lines 155 is stored at rising edges of the clock by flip-flop 135 and on the falling edges by flip-flop 145.

In DDR applications, the edges of data transitions at the DQ lines 155 are aligned to the edges of the clock signal at the DQS line 110. To facilitate the storing of data by flip-flops 135 and 145, it is desired that the clock signal provided to the flip-flops 135 and 145 is phase shifted or delayed by 90 degrees, such that it is in quadrature with the data at DQ lines 155 and the DQS signal on line 110. Accordingly, the delay of variable-delay buffer 120 is adjusted such that the clock signal on line 140 is 90 degrees behind the clock signal applied to DQS pin 110. That is, the clock signal on line 140 is delayed one-quarter cycle relative to the DQS signal. For additional flexibility the variable-delay buffer 120 may be bypassed by selecting the appropriate input of multiplexer 125. This is useful, for example, in applications where the DQS signal is already shifted by 90 degrees relative to the data.

Each signal line shown may be single ended or differential. For example, the buffer 130 may have differential outputs, where an output connects to a clock input of flip-flop 135 and a complementary output connects to a clock bar input of flip-flop 145.

One skilled in the relevant art appreciates that this block diagram may be drawn differently. For example, the buffers 165 may be eliminated or incorporated into the flip-flops 135 and 145. Again, the flexibility provided by multiplexer 125 may be optional, and as such it may be removed in some embodiments. As a further example, the buffer 130 may be eliminated or subsumed into the multiplexer 125 or variable-delay buffer 120.

In a specific embodiment, each of these circuits is made using a complementary-metal-oxide-silicon (CMOS) process. In alternate embodiments, they may be made using a bipolar, BiCMOS, silicon germanium (SiGe), gallium arsenide (GaAs) or other III-V process, or other appropriate technology.

Figure 2:
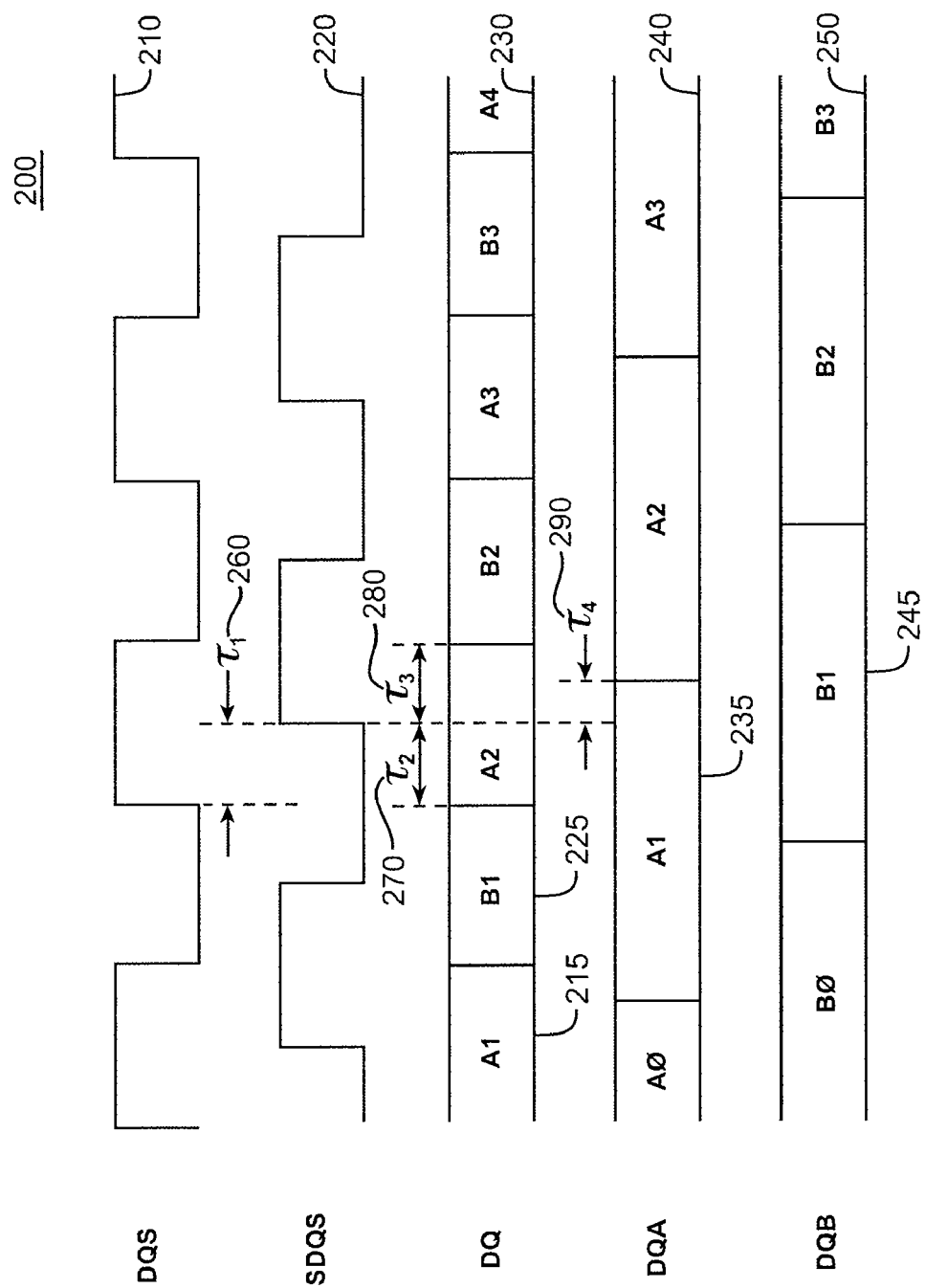
FIG. 2 is a timing diagram for the DDR interface of FIG. 1.

FIG. 2 is a timing diagram 200 for the DDR interface of FIG. 1. Included are DQS input clock signal 210, delayed clock signal SDQS 220, input data signal 230, and data outputs DQA 240 and DQB 250. The clock signal DQS 210 alternates between a first level and a second level. Delayed clock signal SDQS 220 is shifted relative to DQS 210 by a duration t1 260, which corresponds to 90 degrees, or one-quarter a DQS clock cycle. Data signal DQ 230 is made up of data bits such as A1 215 and B1 225. A1 215 and B1 225 may have the same polarity—or logic level—or they may have the opposite polarity. They each may be either at the first level or the second level. Typically, the edges of the DQ signal 230 are approximately aligned to the edges of the DQS signal 210. Clocking the DQ signal 230 with SDQS signal 220 allows for a maximum set-up time t2 270 and hold time t3 280, thus facilitating the storing of the data in flip-flops 135 and 145. Moving a clock edge to the middle of a data bit in this way is referred to as window centering. The two flip-flops 135 and 145 provide de-interleaved outputs on lines 137 and 147. Specifically, signal DQA 240 includes every other bit, shown here as the "A" bits, (such as A1 235), while data at DQB provides the other alternating data bits (such as B1 245). A change in DQA 240 follows a rising edge of SDQS 220 by a delay t4 240. A change in DQB 250 follows a falling edge of SDQS 220 by a similar duration.

Each of the signals in this and other included timing diagrams are capable of alternating at least between a first logic level and a second logic level. The first logic level may be what is commonly referred to as a logic low, while the second logic level may be a logic high. Alternately, the first logic level may be a high and the second logic level a low. The first logic level for each signal may be substantially the same voltage. This is often true in CMOS devices, for example, where the logic levels roughly correspond to the supply voltage and ground. Alternately, the first logic levels may have different voltage levels for some or all signals. This is often true in circuits made using a bipolar-CMOS (BiCMOS) process, or where different circuits are powered at different supply voltages. In a BiCMOS device, bipolar logic circuits may use one set of voltages for the first and second logic levels, while CMOS logic circuits use another. Similarly, the second logic levels of each signal may have substantially the same voltage, or some or all may have a different voltage.

Each signal may be single ended or differential. For some differential signals, when a signal is at a first logic level, its complement is at the second logic level. For other differential signals, the complementary signal is at a DC voltage that is between the voltage of the first logic level and the voltage of the second logic level.

Figure 3:
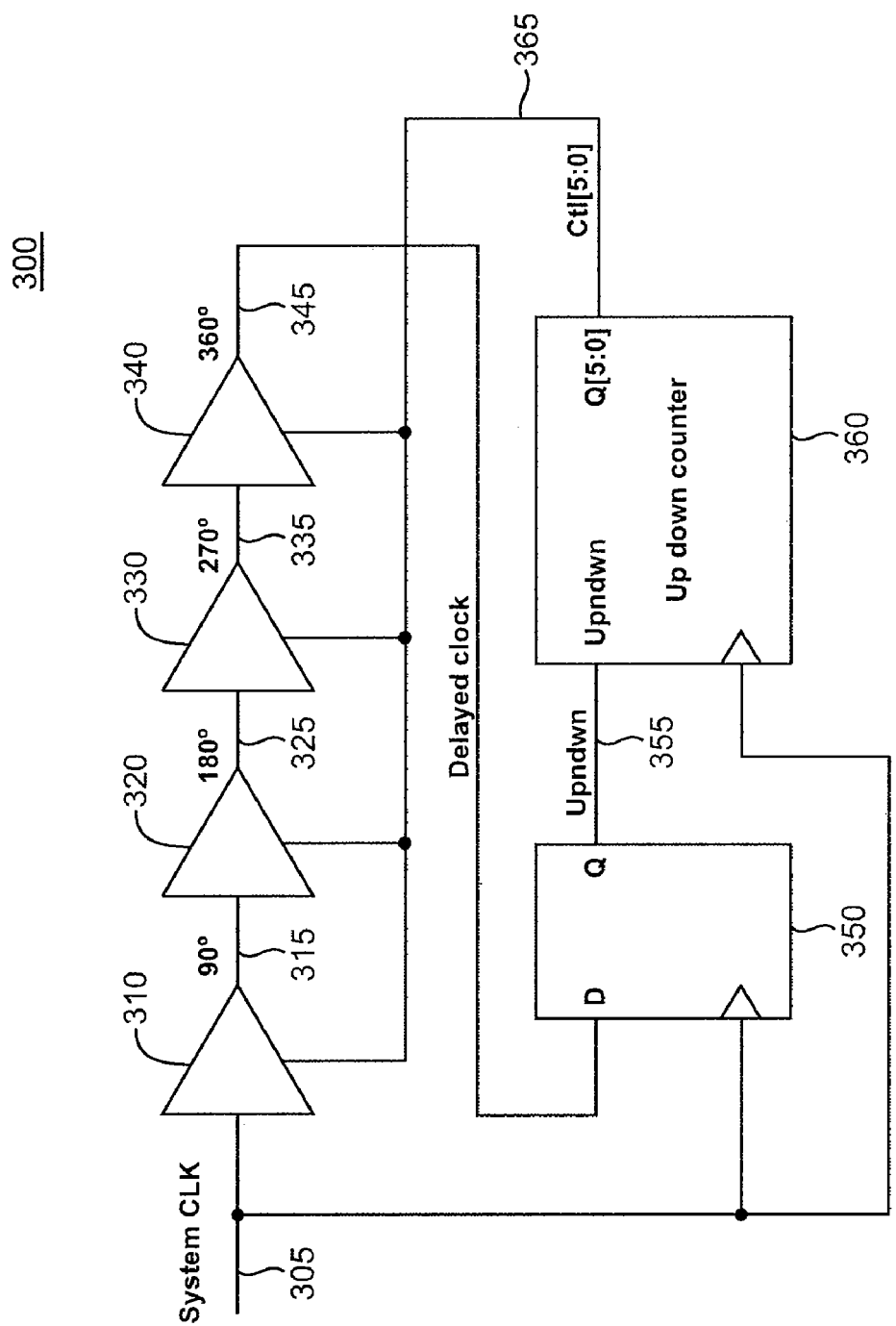
FIG. 3 is a block diagram of a control block consistent with an exemplary embodiment of the present invention.

FIG. 3 is a block diagram 300 showing an exemplary implementation for the control block 170 shown in FIG. 1. Included are four variable-delay buffers 310, 320, 330, and 340. In other embodiments, other numbers of variable-delay buffers may be used. For example, 8 buffers may be used. Also, each buffer may include other buffers or sub-buffers. Each of these variable-delay buffers contribute approximately 90 degrees of phase shift to the system clock applied on line 305. Each of these variable-delay buffers match the variable-delay buffer 120 in FIG. 1, or a similar delay buffer in other embodiments of the present invention.

Variable-delay buffer 340 provides an output to phase detector 350, where it is compared to the system clock on line 305. The outputs of the phase detector 350 drive the up/down counter 360, which is clocked by the system clock on line 305. The up/down counter provides an output bus Ct[5:0] 365 to the four variable-delay buffers in this figure and the variable-delay buffer 120 in FIG. 1. Phase detector 350 compares the phase of the delayed clock from the fourth variable-delay buffer against the phase of the system clock on line 305. The phase detector 350 determines whether a rising edge of the system clock precedes a rising edge of the delayed clock.

In a specific embodiment, this is done by a D-type flip-flop that determines the level of the delayed clock on line 345 at the rising edges of the system clock on line 305. If the level of the delayed clock is low, the rising edge of the system clock has come before the rising edge of the delayed clock, meaning the delayed clock has been excessively delayed. This results in a low for the up/down signal 355, which instructs the up/down counter 360 to count down by one so as to reduce the delay through the variable-delay buffers. Conversely, if the delayed clock signal on line 345 is high when the system clock on line 305 transitions high, the delayed clock has not been sufficiently delayed. The output of the phase detector 350 is high, which instructs the up/down counter 360 to count up by one, thus increasing the delay through the variable-delay buffers.

Again, in a specific embodiment, the level of the delayed clock on line 345 is determined at the time of the rising edges of the system clock on line 305. In other embodiments the rising edges of the delayed clock on line 345 may be compared to the rising edges of the system clock 305, for example, by using an RS flip-flop for the phase detector 350. Other methods of comparing the phase relationship of these two signals may be used.

Figure 4:
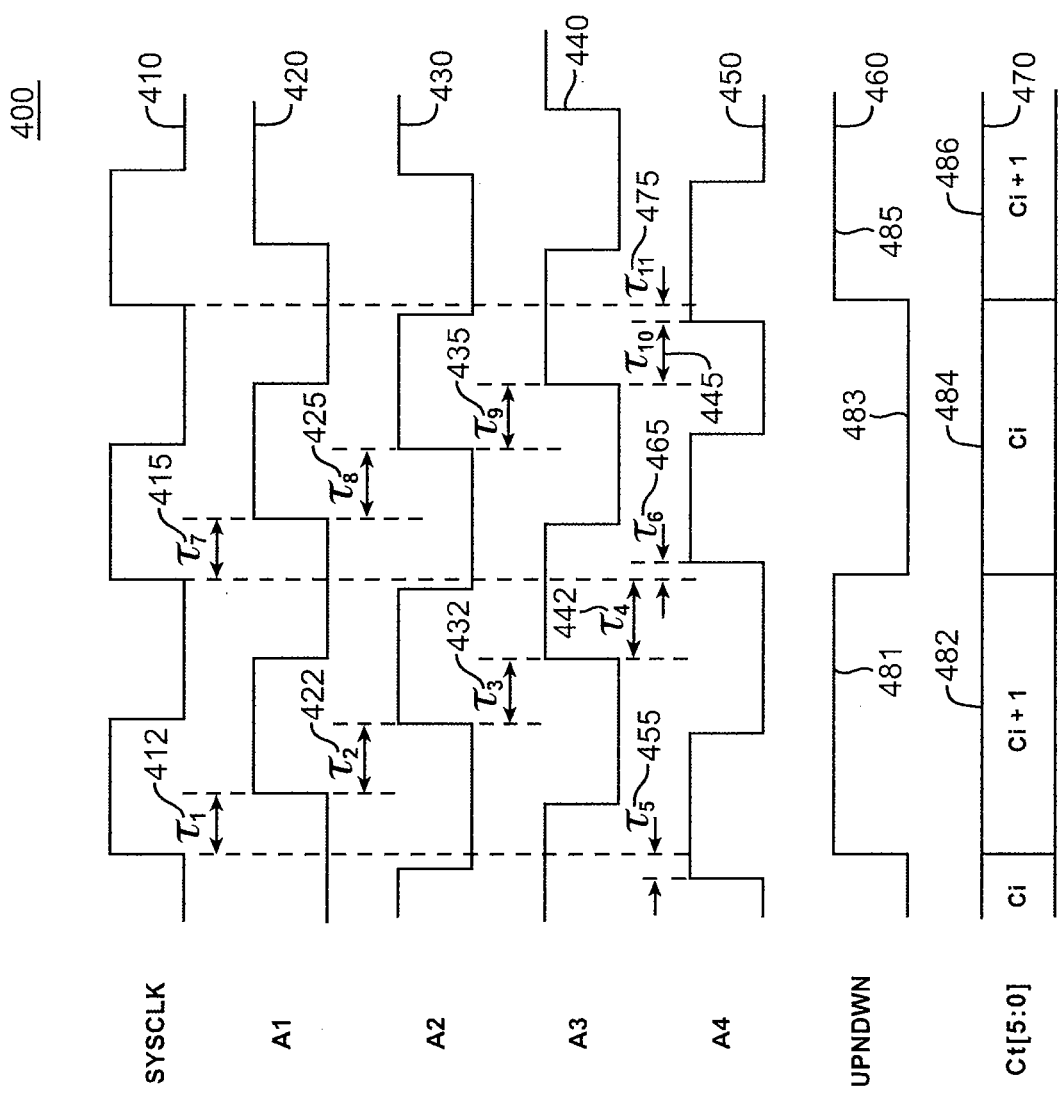
FIG. 4 is a timing diagram for the control block shown in FIG. 3.

FIG. 4 is a timing diagram 400 for the control block 300 shown in FIG. 3. A system clock 410 transitioning between a first level and a second level is received. The system clock 410 is delayed by variable-delay buffers (or elements or blocks) generating signals A1 420, A2 430, A3 440, and A4 450. The level of signal A4 is determined at each rising edge of system clock 410. For example, at time t5 455 the rising edge of A4 precedes the rising edge of the system clock 410 such that A4's level is high at the rising edge of system clock 410. This leads to a high level 481 for the up/down signal 460, which causes the up/down counter to increment from Ci to Ci+1 during time 482. The increase in count alters the variable delay through the variable-delay buffers that generate signals A1 through A4. This causes an increase in the delay times t1 412, t2 422, t3 432, and t4 442. As a result, in this example, the rising edge of A4 follows the rising edge of the system clock 410 at time t6 465. The up/down signal 460 is low at 483, which reduces the count of up/down counter 470 to Ci during time 484. This reduction in count reduces the delay through the variable-delay buffers, such that delays t7 415, t8 425, t9 435, and t10 445 are decreased. Because of this, the rising edge of A4 450 precedes the rising edge of the system clock 410 at time t11 475. As before, this results in a high signal level for up/down 460, which increases the count of the up/down counter 470 to Ci+1 during time 486. As can be seen, during a locked state, the up/down counter often "ping-pongs" or alternates between two different states, shown here as Ci and Ci+1.

Figure 5:
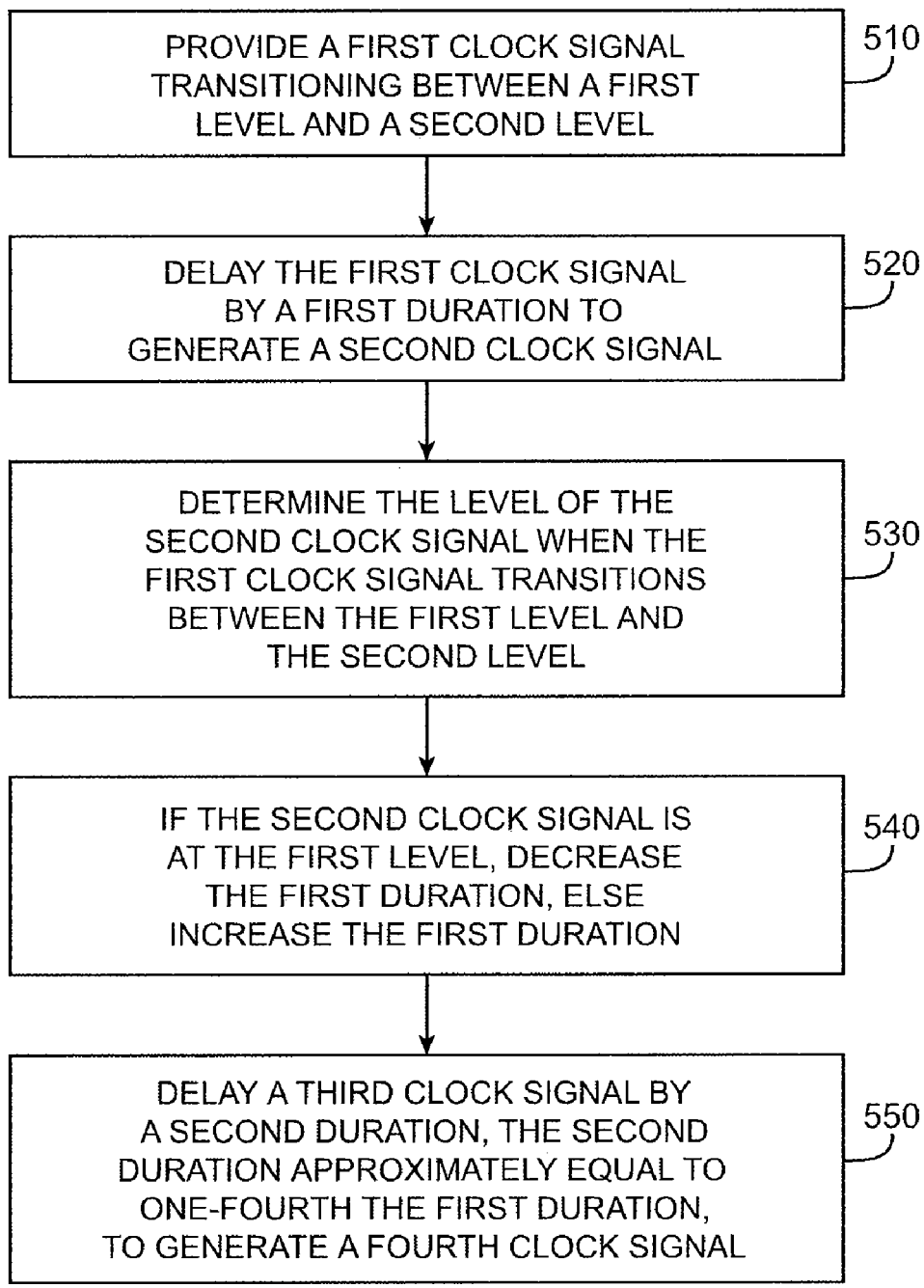
FIG. 5 is a flowchart of a method of the delaying a clock signal in accordance with embodiment of the present invention.

FIG. 5 is a flowchart 500 of a method of the delaying a clock signal in accordance with an embodiment of the present invention. In act 510, a first clock signal transitioning between a first level and a second level is received. The first clock signal is delayed by a first duration to generate a second clock signal in act 520. In act 530, the level of the second clock signal is determined at the time when the first clock signal transitions from the first level to the second level. If the second clock signal is at the first level, the first duration is decreased. If the second clock signal is at the second level, the first duration is increased in act 540. In act 550, a third clock signal is delayed by a second duration, the second duration approximately equal to one-fourth the first duration, to generate a fourth clock signal. In this way, the third clock signal is phase shifted by 90 degrees to generate a fourth clock signal.

There are at least two potential difficulties that should be considered when implementing the circuit of FIG. 3. First, when the up/down counter increments or decrements to change the delay through the variable-delay buffers, only the duration of one clock cycle is available for the variable-delay buffers to settle. For example, in FIG. 4, as the Ct[5:0] signal 470 changes in value, for example, between times 482 and 484, only one clock cycle passes before a new decision regarding whether to increment or decrement the counter must be made at time t11 475. Second, if the delay of the variable-delay buffers is significantly incorrect, the loop may not be able to adjust properly. This may be particularly true in designs where the input-frequency capture range is large to accommodate the tolerances for various integrated circuit components.

Figure 6:
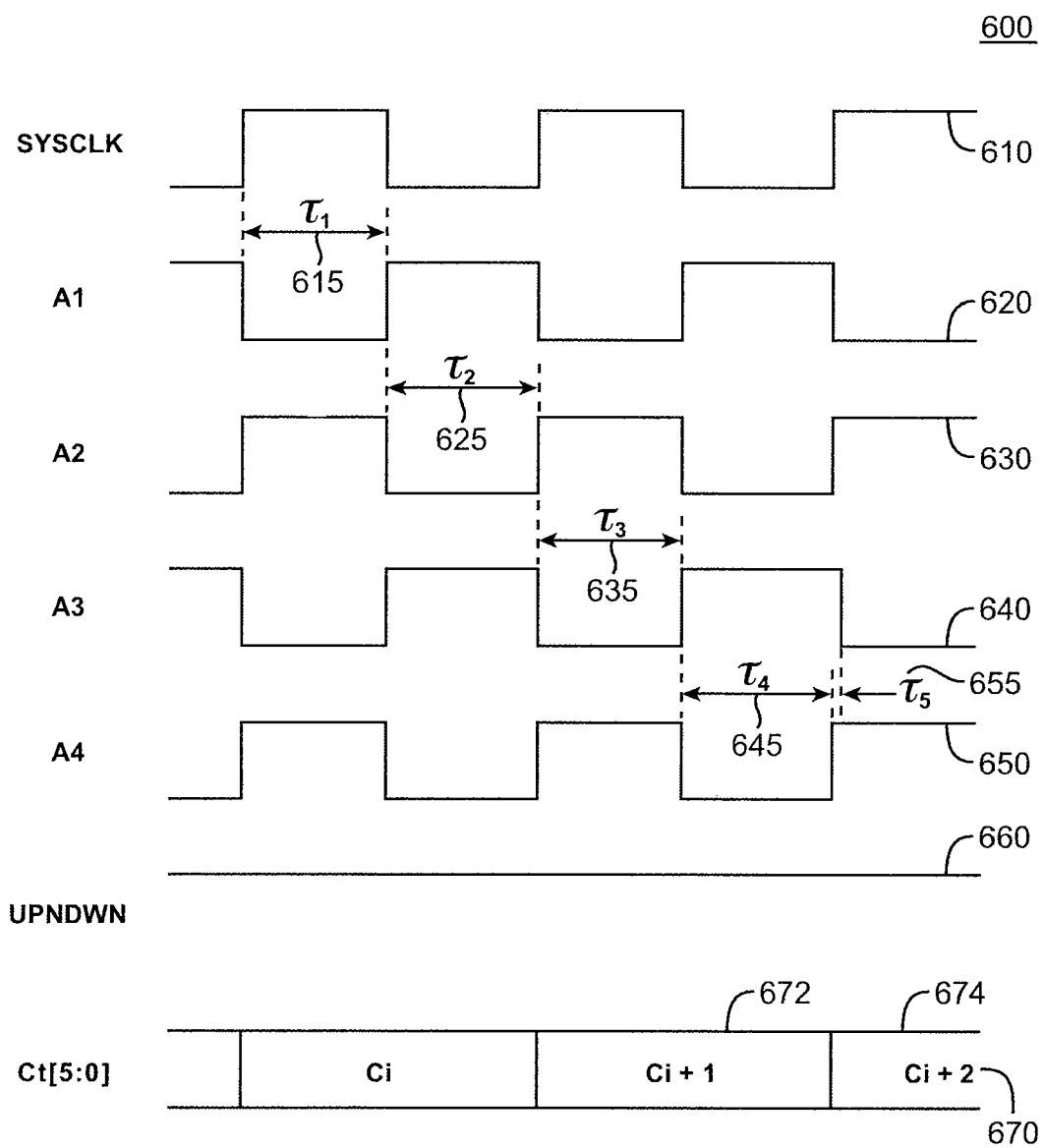
FIG. 6 is a timing diagram showing the operation of the control block in FIG. 3 when the delay is through the variable-delay buffers are excessive.

FIG. 6 is a timing diagram 600 showing the operation of the control block 300 in FIG. 3 when the delays through the variable-delay buffers are excessive. Specifically, the SYSCLK 610 is delayed by a duration t1 615, resulting in signal A1 620, which is again delayed by a duration t2 625, resulting in signal A2 630. This signal is again delayed, this time by a time t3 635, resulting in signal A3 640, which is again delayed by a duration t4 645, resulting in signal A4 650. In a specific embodiment, the delays t1 through t4 are approximately equal.

As can be seen in this example, an edge of SYSCLK 610 is delayed approximately two clock cycles through the variable-delay buffers. But since the rising edge of A4 650 precedes a rising edge of SYSCLK 610 at time t5 655, the up/down signal 660 is high, and the up/down counter output 670 increments by one from time 672 to time 674. This has the effect of further increasing the delays t1 through t4 until each delay is approximately 180 degrees or one-half a clock cycle resulting in the total delay of 2 clock cycles. Because of this, the loop is not able to recover and shorten the cumulative delay through the variable-delay buffers to one clock cycle. This also happens if the delays t1 through t4 are other multiples of 90 degrees, such as 270 or 360 degrees, when the total delay through the variable-delay buffers is three and four clock cycles.

Figure 7:
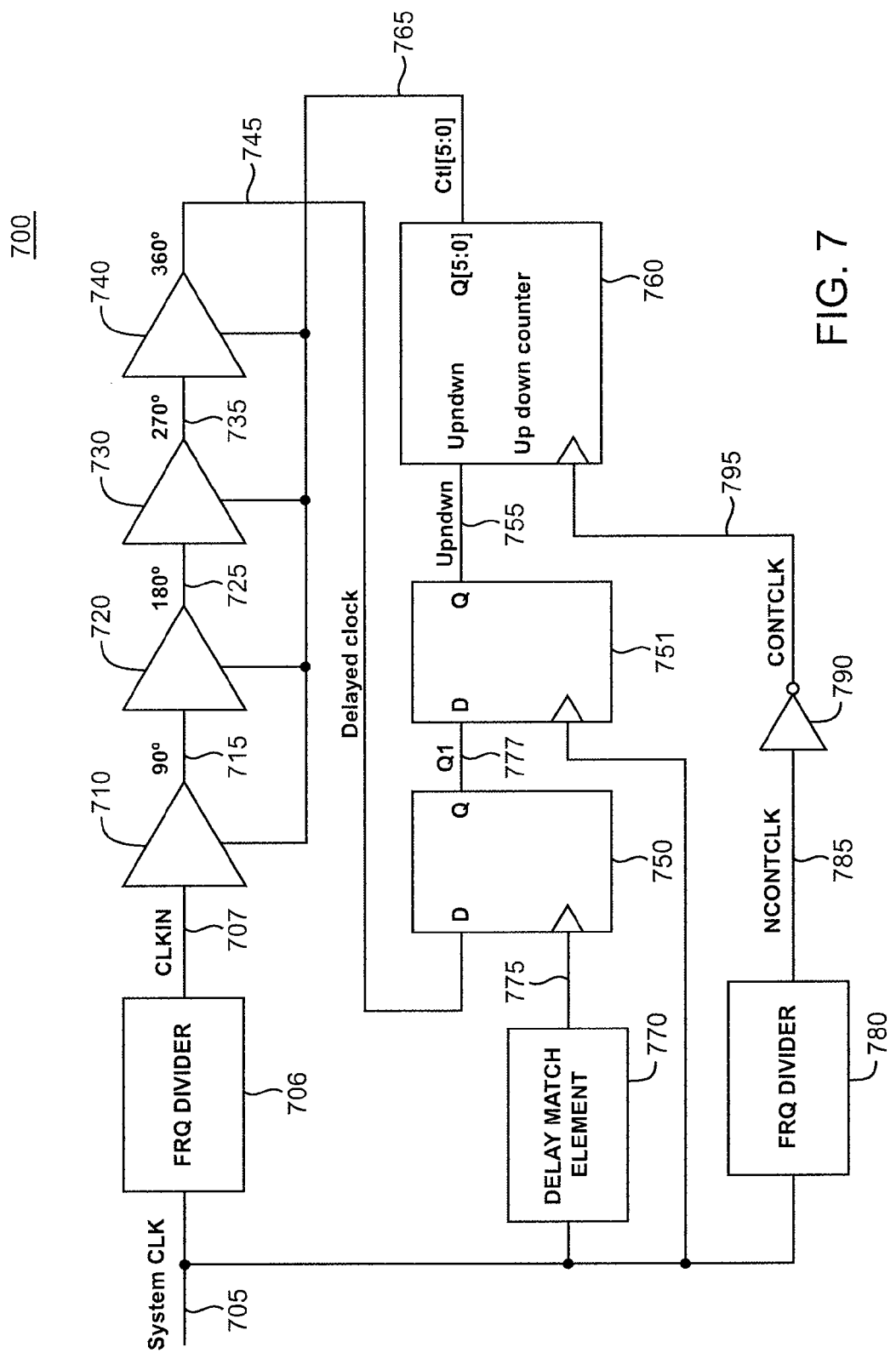
FIG. 7 is a block diagram of a control block consistent with an embodiment of the present invention.

FIG. 7 is a block diagram 700 of an alternative implementation for a control block consistent with another exemplary embodiment of the present invention. This block can be used for control block 170 in FIG. 1, or other embodiments of the present invention. Circuitry that mitigates both the above obstacles is included. Shown are frequency dividers 706 and 780, variable-delay buffers 710, 720, 730, and 740, phase detector 750, flip-flop 751, up/down counter 760, and inverter 790. The up/down counter may be a binarily-weighted, thermal, or other type of up/down counter, such as a combination binarily-weighted and thermal counter. In a specific embodiment, the counter is binarily weighted.

A system clock signal on line 705 is received by frequency divider 706. Frequency divider 706 divides the system clock signal's frequency, thereby generating the CLKIN signal on line 707. In a specific embodiment, frequency divider 706 divides the system clock frequency by 8. Alternately, other frequency divisions are possible, such a divide by 4, 16, or other value. The lower frequency CLKIN signal on line 707 is delayed by variable-delay buffers 710, 720, 730, and 740. A delayed clock signal on line 745 is provided to phase detector 750. Delay match element 770 is designed to match the delay in the frequency divider 706, and provide an output signal on line 775 to the phase detector 750. The phase detector 750 determines the phase relationship between the system clock and the delayed clock, for example, whether a rising edge of the system clock precedes a rising edge of the delayed clock. Alternately, the phase detector may determine whether a falling edge of the system clock precedes a falling edge of the delayed clock.

In a specific embodiment, phase detector 750 does this by determining the level of the delayed clock signal on line 745 at the rising edges of the clock signal on line 775. This level detection results in output signal Q1 on line 777, which is input to flip-flop 751. Flip-flop 751 is clocked by the system clock on line 705 and provides the up/down signal 755 to the up/down counter 760. A second frequency divider 780 divides the system clock's frequency, thus generating signal NCONTCLK on line 785. Again, in a specific embodiment of the present invention, frequency divider 780 divides the system clock frequency by eight. In other embodiments, this divisor may be different, such as 4, 16, or other appropriate value. The NCONTCLK signal on line 785 is inverted by inverter 790, resulting in a CONTCLK signal on line 795. The CONTCLK signal on line 795 clocks the up/down signal on line 755 into the up/down counter, resulting in the output signal Ct[5:0] on bus 765.

Again, when the output of up/down counter 760 changes, the delays through the variable-delay buffers 710 through 740 change. But this change in delay is not instantaneous, and takes a finite duration to reach a final value. In a specific embodiment, frequency dividers 706 and 780 are separate frequency dividers such that their output edges may be timed to give the variable-delay buffers 710 through 740 a maximum duration in which to settle. In other embodiments, frequency dividers 706 and 780 may be the same frequency divider.

Again, the delay match element 770 is designed to match the delay between a system clock rising edge and a CLKIN rising edge on lines 705 and 707. Matching these delays enables the phase detector 750 to adjust the delay of the variable-delay buffers 710 through 740 with a minimum amount of systematic delay errors.

The variable-delay buffers 710 through 740 match or are similar to the variable-delay buffer 120 in FIG. 1. The cumulative delay provided by variable-delay buffers 710–740 is one clock cycle or 360 degrees. In a double-data-rate interface the delay of the variable-delay buffer 120 in FIG. 1 is one-fourth the cumulative delay of the variable-delay buffers 710 through 740, or one-quarter of a clock cycle or 90 degrees. In other multiple-data-rate interfaces the phase shift may be different, and there may be more variable-delay buffers like 120 in FIG. 1 providing different delays. For example, delays of 60 and 120, or 45, 90, and 135 degrees may be provided by multiple variable-delay buffers connected in series or parallel. These delays can be used in triple and quadruple-data-rate interfaces, respectively. Alternately, they may be used in other data-rate interfaces.

In other embodiments, the system clock and DQS signal may be harmonics or have frequencies that are multiple of each other. For example, the DQS signal may be the second harmonic, or have twice the frequency of the system clock. In that case, a delay of one system clock cycle in the divided system clock signal CLKIN corresponds to a two cycle delay in the DQS signal. Accordingly, eight elements may be used in the system clock delay path, while one matching element is used in the DQS path.

One skilled in the relevant art appreciates that this block diagram may be drawn differently without deviating from the scope of the present invention. For example, the phase detector 750 and flip-flop 751 may be considered as a single phase detector block. Also, the flip-flop 751 may be considered as a block inside the up/down counter 760. Further, the variable-delay buffers 710 through 740 may be in front of the frequency divider 706, or some of the variable-delay buffers 710 through 740 may be in front of the frequency divider 706, while the remainder follow it.

Figure 8:
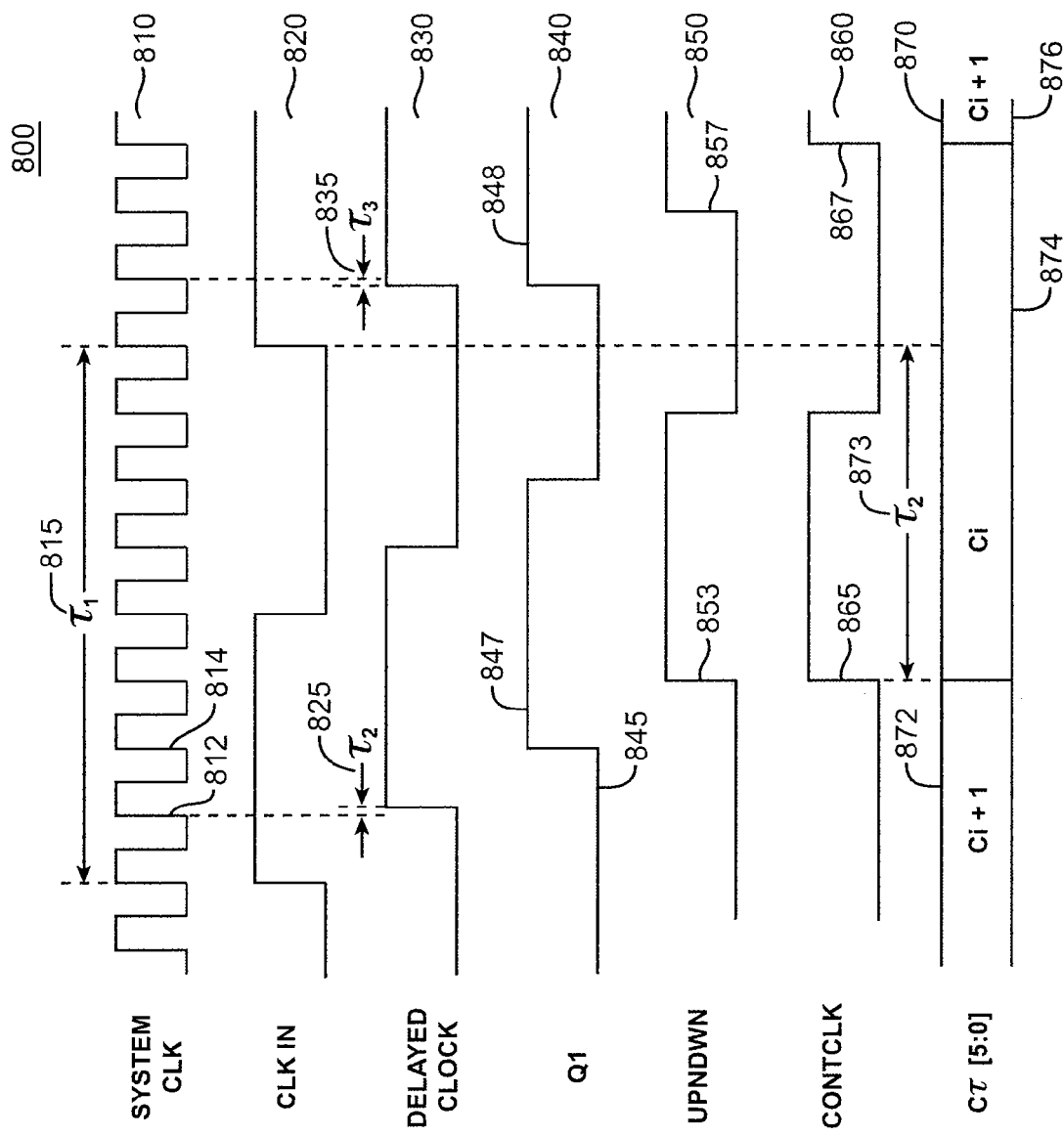
FIG. 8 is a timing diagram for the control block of FIG. 7.

FIG. 8 is a timing diagram 800 for the control block of FIG. 7. A system clock signal 810 is provided, transitioning between a first level and a second level. The frequency of the system clock signal 810 is divided by eight to produce CLKIN 820. That is, eight system clock cycles corresponding to t1 815 resulting in one cycle of CLKIN 820. In other embodiments, it may be divided by 4, 16, or other value. CLKIN 820 is delayed, thus generating the delayed clock signal 830. For simplicity, the gate delays through the frequency divider and match delay elements are shown to be zero.

At each rising edge of the system clock 810, the level of the delayed clock 830 determines the level of Q1 840. For example, at time t2 825, the rising edge of the delayed clock signal 830 follows—occurs after—the rising edge of the system clock signal 810. Thus, the level of the delayed clock signal 830 is low at the corresponding rising edge 812 of the system clock 810. Accordingly, the level of Q1 840 remains low at time 845. At the next system clock rising edge 814, the level of the delayed clock signal 830 is high, and Q1 840 is high at time 847.

The upndwn signal 850 is the signal Q1 840 retimed to the system clock, and follows Q1 840 by approximately one clock cycle less the delay through the matched delay element. The rising edge 865 of contclk signal 860 is aligned to store the resulting value of upndwn 850, in this example a low. This low causes the count Ct[5:0] to be decremented by one, from Ci+1 to Ci from time 872 to 874. The upndwn signal 850 may be delayed by a setup time to ensure proper clocking by the contclk signal 860.

In this specific example, a decrease in the count causes the delay from a rising edge of CLKIN 820 to a rising edge of the delayed clock 830 to decrease. Accordingly, at time t3 835, the rising edge of the delayed clock 830 precedes the rising edge of the system clock 810, such that Q1 is high at time 848. Accordingly, upndwn 850 is high at the rising edge 857 of contclk 860, and the count increases at time 876 to Ci+1. This increases the delay of the next rising edge of the delayed clock signal 830, and the above process repeats itself.

In this example, the loop can be said to be locked, and the count alternates between two values following each rising edge of CLKIN 820. At other times, for example power up, the count may continuously increase or decrease for several cycles of CLKIN 820 until this locked state is reached.

In a specific embodiment, the contclk signal is generated by a separate frequency divider than the one used to divide the system clock 810 to generate CLKIN 820. This allows the loop to be designed such that the variable-delay buffers have the maximum time in which to settle following a change in the up/down counter output. In this example, the time t6 865 is available for settling after a change in the count until the next CLKIN rising edge.

Figure 9:
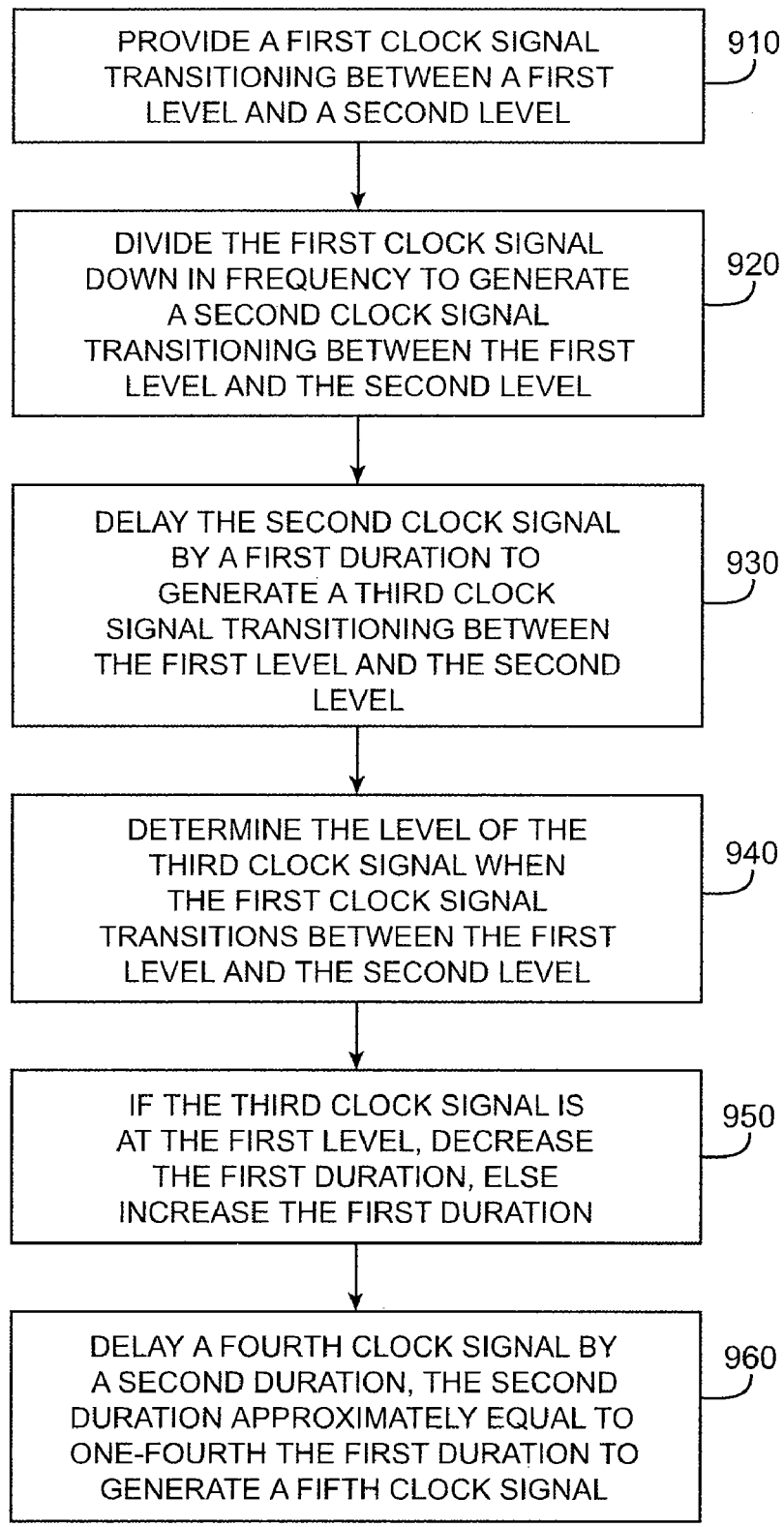
FIG. 9 is a flowchart illustrating a method of delaying a clock signal in accordance with embodiment of the present invention.

FIG. 9 is a flowchart 900 illustrating a method of delaying a clock signal in a multiple-data-rate interface. In act 910, a first clock signal transitioning between a first level and a second level is received. The first clock signal's frequency is divided in act 920 to generate a second clock signal. The second clock signal is delayed by a first duration to generate a third clock signal in act 930. In act 940, the level of the third clock signal is determined at the time the first clock signal transitions from the first level to the second level. If the third clock signal is at the first level, the first duration is decreased. If the third clock signal is at the second level, the first duration is increased in act 950. A fourth clock signal is delayed by a second duration, the second duration approximately equal to one-fourth the first duration, to generate a fifth clock signal in act 960. In this way, the fifth clock signal is delayed by approximately 90 degrees relative to the fourth clock signal.

Figure 10:
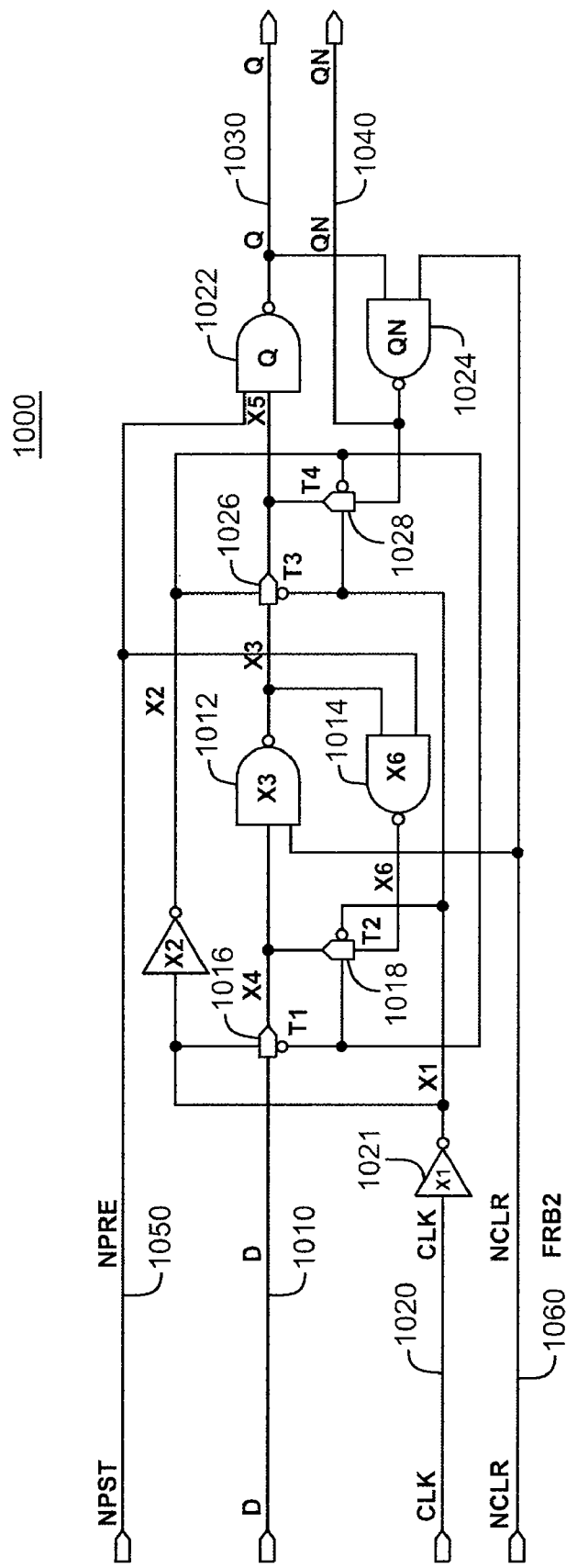
FIG. 10 is a schematic of a flip-flop that may be used as the phase detector in FIG. 7.

FIG. 10 is a schematic 1000 of an exemplary flip-flop that may be used as the phase detector 750 or flip-flop 751 in FIG. 7. This flip-flop may also be used as a part of the frequency dividers 706 or 780, or up/down counter 760, also in FIG. 7. In other embodiments, other flip-flops may be used for these circuits. Input signals include D on line 110, CLK on line 1020, NCLR on line 1060, and NPRE on line 1050. Output signals Q and QN are provided on lines 1030 and 1040. This flip-flop includes two latches, each formed by two AND gates. Gates 1012 and 1014 form a first latch, while gates 1022 and 1024 form the second. Each latch alternates between operating in the pass and latch modes. While one latch is in the pass mode, the other is in the latch mode.

When the first latch is in the pass mode and the second latch is latched, the flip-flop stores data at the D input. In this mode, the feedback path provided by AND gate 1014 is opened by pass gate 1018, and data is passed through pass gate 1016. Also, pass gate 1026 is open, while feedback pass gate 1028 is closed.

When the first latch is latched and the second latch is in the pass mode, the flip-flop outputs a data bit at the Q and QN outputs. In this mode, pass gate 1016 is open, and the feedback path provided by AND gate 1014 is closed by pass gate 1018, allowing data to be retained in the first latch. Also, pass gate 1026 is closed, allowing data from the first latch to be output, while feedback path pass gate 1028 is open.

Figure 11:
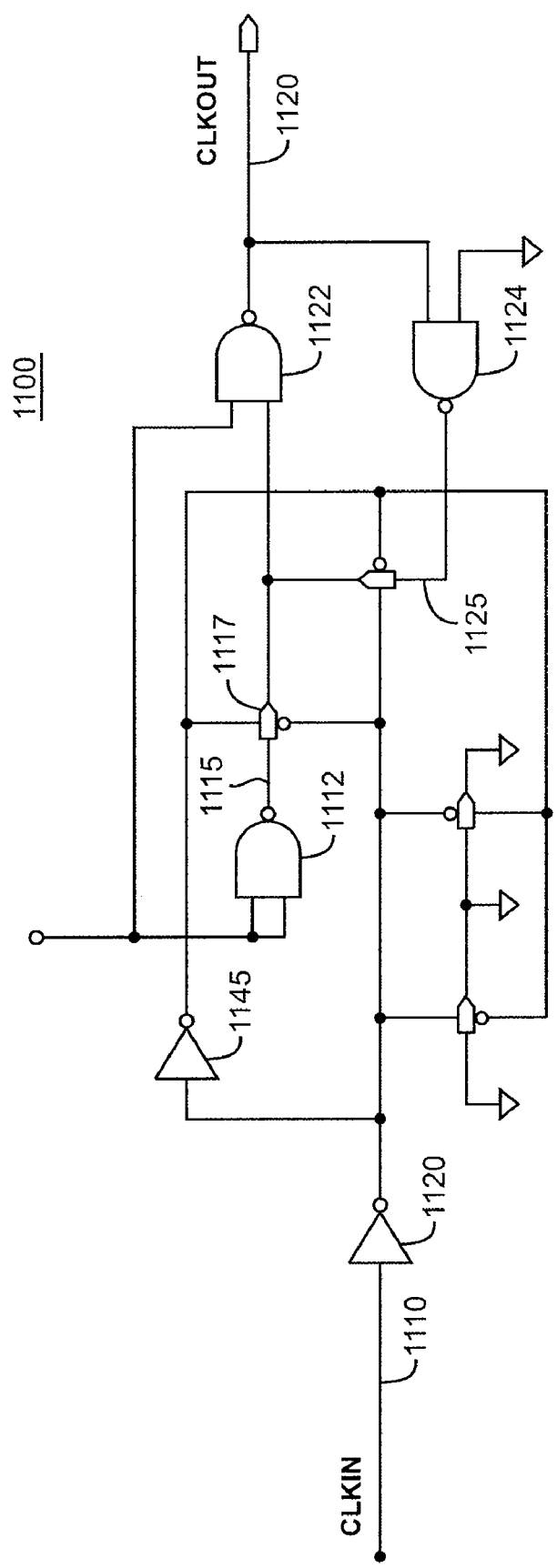
FIG. 11 is a schematic of the delay matching element in FIG. 7.

FIG. 11 is a schematic 1100 showing an exemplary implementation for the match delay element 770 in FIG. 7. The circuit is designed such that the delay from CLKIN on line 1110 to CLKOUT on 1120 matches the clock-to-Q delay of the flip-flop in FIG. 10. The clock-to-Q delay of the flip-flop of FIG. 10 is as follows: a rising edge of the clock signal on line 1020 is inverted by inverter 1021 which turns on pass gate 1026, and shuts off pass gate 1028. The data at the input of pass gate 1026 drives AND gate 1022, resulting in output signal Q on line 1030. Thus, the clock-to-Q delay for the flip-flop of FIG. 10 is approximately equal to the cumulative delays through an inverter, pass gate, and AND gate.

Similarly, the delay through the delay element of FIG. 11 is as follows: CLKIN on line 1110 is inverted by inverter 1120, which turns on pass gate 1117, thus driving AND gate 1122, resulting in a change in the CLKOUT signal on line 1120. Thus, the delay through the delay element is approximately equal to the delay of an inverter, a pass gate, and an AND gate. Accordingly, the delay through this circuit should approximately match the clock-to-Q delay of the flip-flop in FIG. 10.

Figure 12:
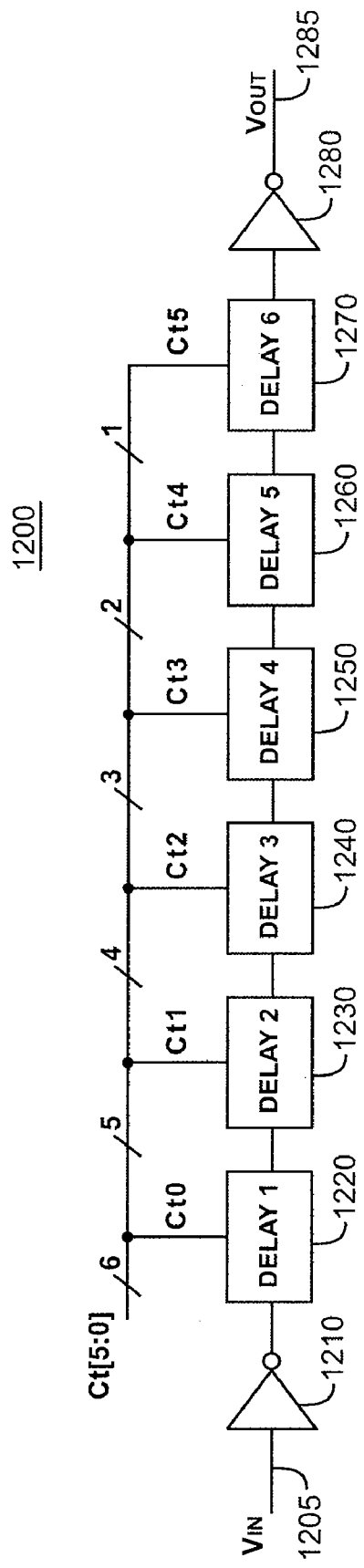
FIG. 12 is a block diagram a variable-delay buffer.

FIG. 12 is a block diagram 1200 showing an exemplary embodiment for a variable-delay buffer, such as buffer 120 in FIG. 1, buffers 310 through 340 in FIG. 3, and buffers 710 through 740 in FIG. 7. Included are inverters 1210 and 1280, and delay elements 1220, 1230, 1240, 1250, 1260, and 1270. Input signal VIN is received on line 1205 by inverter 1210. This inverter squares up (gains up) the input signal and drives delay element DELAY1 1220. The delay through DELAY1 1220 is under control of the LSB Ct0 from the up/down counter. That is, the delay through DELAY1 is adjusted by changing the state of Ct0. DELAY1 1220 in turn drives delay element DELAY2 1230. The delay through DELAY2 1230 is under the control of bit Ct1. DELAY2 1230 in turn drives delay element DELAY3 1240, which is under the control of bit Ct2. DELAY3 1240 in turn drives delay element DELAY4 1250. The delay through the DELAY4 1250 is under the control of bit Ct3. DELAY4 1250 in turn drives delay element DELAY5 1260, which is under the control of bit Ct4. DELAY5 1260 in turn drives delay element DELAY6 1270, controlled by bit Ct4. Delay element DELAY6 1270 drives inverter 1280, which squares up the signal at its input and generates output signal VOUT on line 1285. The delay through DELAY6 1270 is under the control of the MSB bit Ct5.

One skilled in the relevant art would appreciate that other configurations can be used without varying from the scope or spirit of the present invention. For example, a different number of delay elements may be used. For example, one delay element may be used. Alternately, 2, 4, or other appropriate number may be used. Also, the number of inverters may vary. For example, no inverters may be used, or each delay element may be buffered with an inverter.

Figure 13:
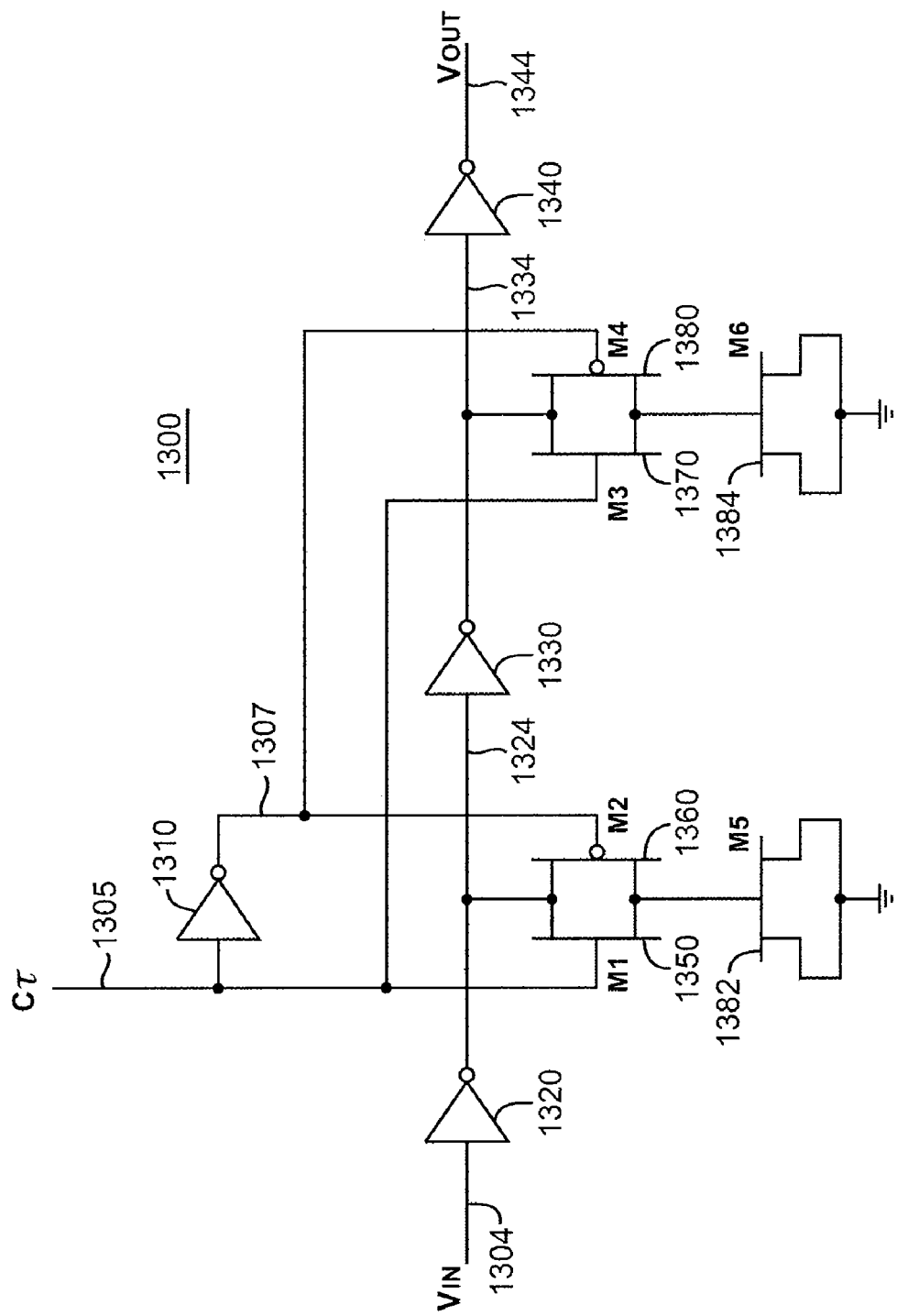
FIG. 13 is a schematic of a delay element.

FIG. 13 is a schematic 1300 showing an exemplary delay element, such as the delay elements 1230 through 1270 in FIG. 12. In a specific embodiment, FIG. 13 is the schematic for DELAY1 1220, DELAY2 1230, DELAY3 1240, and DELAY4 1250. Included are signal path inverters 1220, 1230, and 1240, control inverter 1310, and pass gates formed by devices M1 1350 and M2 1360, and M3 1370 and M4 1380, and MOS capacitors M5 1382 and M6 1384.

When the signal Ct0 on line 1305 is high, the output of inverter 1310 on line 1307 is low. Accordingly, the pass gates formed by M1 1350 and M2 1360, and M3 1370 and M4 1380, are in their pass modes, and capacitors M5 1382 and M6 1384 are connected to the output of inverters 1320 and 1330. In this case, when Vin on line 1304 transitions, the output of inverter 1320 drives the capacitor formed by the gate of M5 1382. This slows the resulting edge of the signal on line 1324, thus delaying the signal to the inverter 1330. Likewise, the output of inverter 1330 drives the capacitor formed by the gate of device M6 1384, thus slowing the transition of the signal on line 1334 and delaying Vout on line 1344.

Conversely, if the signal CT0 on line 1305 is low, the signal on line 1305 is high. In this case, the pass gates formed by M1 1350 and M2 1360, and M3 1370 and M4 1380 are open. Accordingly, the inverters 1320 and 1330 do not drive the capacitors formed by the gates of M5 1382 and M6 1384. As a result, the signal Vout is not delayed by the capacitors.

Inverter 1340 squares up the output signal Vout, such that the next stage sees similar rising and falling edges regardless of the state of the Ct signal. This avoids the change in the delay through the next stage that would otherwise occur as the rise and fall times varied as Ct changed. This isolation between delay elements helps ensure a predicable change in delay for a changing count from the up/down counter.

Figure 14:
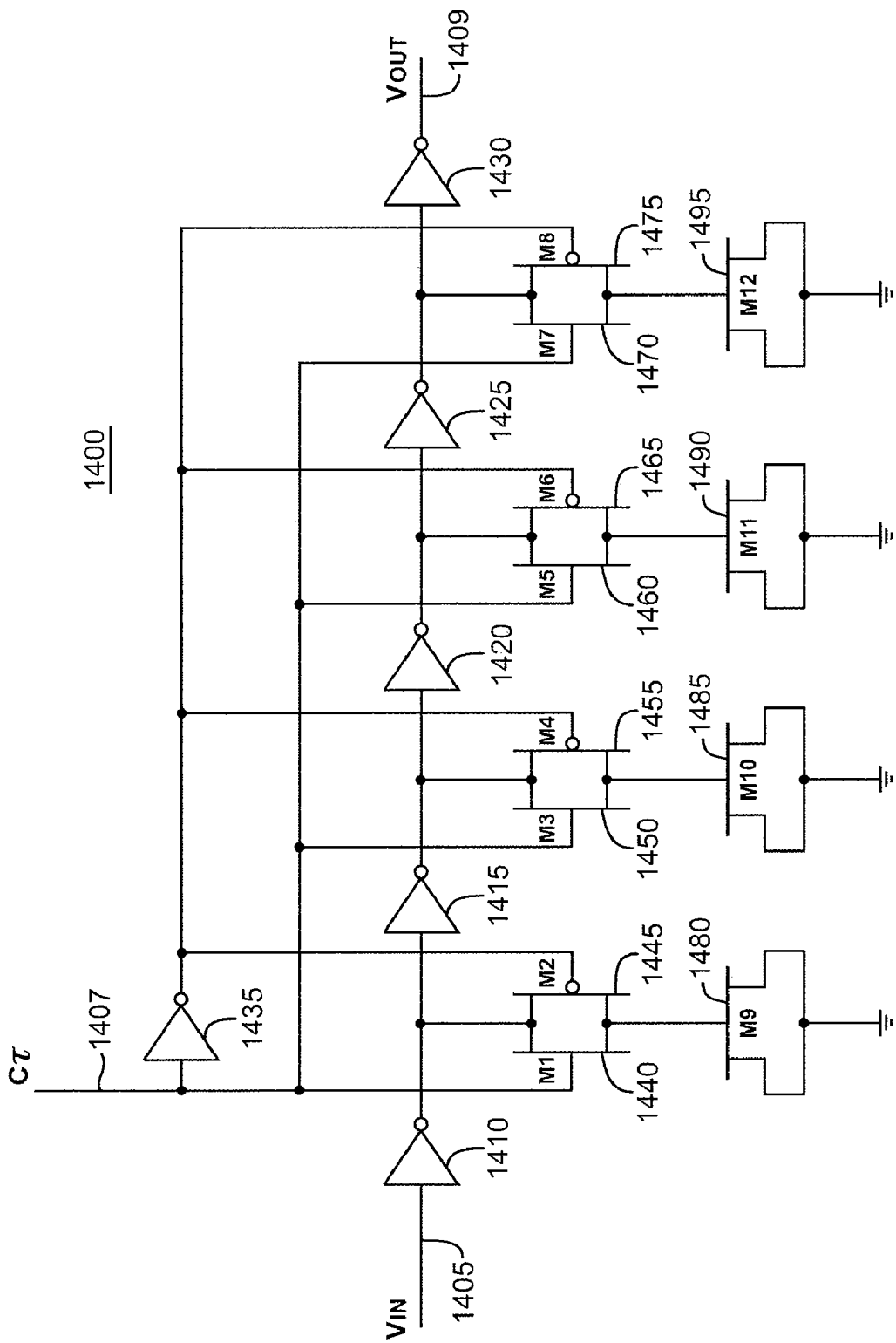
FIG. 14 is a schematic of another delay element.

FIG. 14 is a schematic 1400 of another exemplary delay element, such as the delay elements 1230 through 1270 in FIG. 12. In a specific embodiment, FIG. 14 is the schematic for DELAY5 1260. Included are signal path inverters 1410, 1415, 1420, 1425, and 1430, control inverter 1435, and pass gates formed by devices M1 1440 and M2 1445, M3 1450 and M4 1455, M5 1460 and M6 1465, and M7 1470 and M8 1475, and MOS capacitors M9 1480, M10 1485, M11 1490, and M12 1495.

When the Ct signal on line 1407 is high, the output of inverter 1435 is low. Accordingly, the pass gates are in their pass modes, and the capacitors are connected to the output of inverters 1410 through 1425. In this case, when Vin on line 1405 transitions or changes state, the output of inverter 1410 drives the capacitor formed by the gate of M9 1480. This slows the edge of the resulting signal, thus delaying the signals arrival at inverter 1415. Likewise, the output of inverter 1415 drives the capacitor formed by the gate of device M10 1485, thereby slowing the output signal. In a similar fashion, the outputs of inverters 1420 and 1425 are delayed, thereby delaying the signal Vout on line 1409.

If the signal Ct0 on line 1407 is low, its output signal is high. In this case, the pass gates are open. Accordingly, the inverters 1410 through 1425 do not drive the capacitors formed by the gates of devices M9 through M12. As a result, the signal Vout is not delayed by the capacitors.

Again, inverter 1430 squares up the output signal Vout on line 1409 such that the next stage sees similar rising and falling edges independent of the state of the Ct signal. This avoids the change in the delay through the next stage that would otherwise occur as the rise and fall times varied as Ct changed. This isolation between delay elements helps ensure a predicable change in delay for a changing count from the up/down counter.

In a specific embodiment, delay element DELAY6 1270 includes a series of nine inverters, with pass gates at the outputs of the first eight, the pass gates connecting or disconnecting capacitors from the inverter outputs, under control of a Ct bit and inverter.

In this specific embodiment, the up/down counter is binarily weighted. Accordingly, the variability of the delay through the variable-delay buffers is binarily weighted. As a first approximation, the capacitors in DELAY1 1220 through DELAY4 1250 are successively twice the size of the last delay element. The capacitors in DELAY 6 1270 and DELAY5 1260 are the same as in DELAY4 1250, since there are twice as many of them in each successive element. But this is not expected to be exact, since not all the delay is due to capacitors; part of the delay is the inherent delay through the inverters themselves. Moreover, there are parasitic and loading capacitances to account for.

The pass gates further complicate matters, since they have a parasitic resistance that de-Qs the capacitors, which effectively changes their size. To some extent, it is desirable to increase their size in proportion to the capacitor value. But there are two drawbacks to this. First, the sizes of the devices can become somewhat unwieldy. Second, the parasitics of the source/drain connections at the output of the inverters act as a load even when the pass gates are open. Thus, larger devices decrease the variability of the variable-delay buffers between their states.

In this specific embodiment, the signal path inverters themselves are the same size. In other embodiments, the inverters may be similarly scaled. Typically the control bit inverters can all be the same size.

Again, in FIG. 1, the control block 170 provides control bits on lines 160 to the variable delay buffer 120. When the control block 170 changes the state of more than one control bit, there may be a skew or mismatch in timing such that one control bit changes before another. When skew of sufficient duration exists between these transitions, the delay through the variable delay buffer 120 can change to an undesired value.

As illustrated in the timing diagram of FIG. 8, when a control circuit, such as the control circuit in FIG. 7, is in lock, the control bits on lines 160 typically toggle between two values, identified as Ci and Ci+1 in FIG. 8. If these values occur at a major carrying, for example between codes 100000 and 011111, the effects of skew between these state changes may be quite dramatic.

Figure 15:
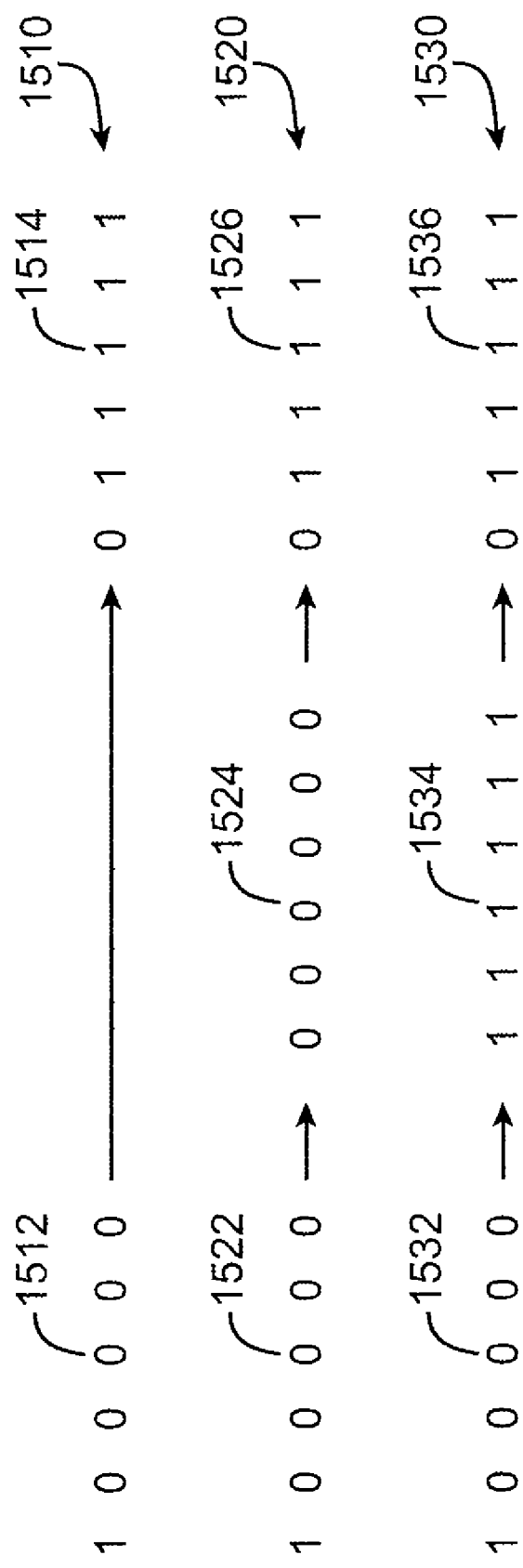
FIG. 15 illustrates a change in state at a major carry where six control bits provided by a control block.

FIG. 15 illustrates a change in state at a major carry where six control bits are provided on lines 160 by control block 170. Line 1510 illustrates a change in state from 100000 1512 to 0111111 1514. If there is skew between the bits in this transition, one of many transitory intermediate states may occur. For example, in line 1520, the MSB, which has a value of 1, transitions to a value of zero before the other bits change, such that a state of 000000 1524 is presented to the variable delay buffer 120. Similarly, in line 1530, the MSB is the last bit to change, such that a code of 111111 1534 is presented by the control block 170 to the variable delay buffer 120. In these circumstances, the delay through the variable delay buffer 120 can vary with time such that the data is not properly latched into input registers 135 and 145. This could be mitigated by changing the coding to a gray code, however this complicates the counter and delay element circuitry.

Figure 16:
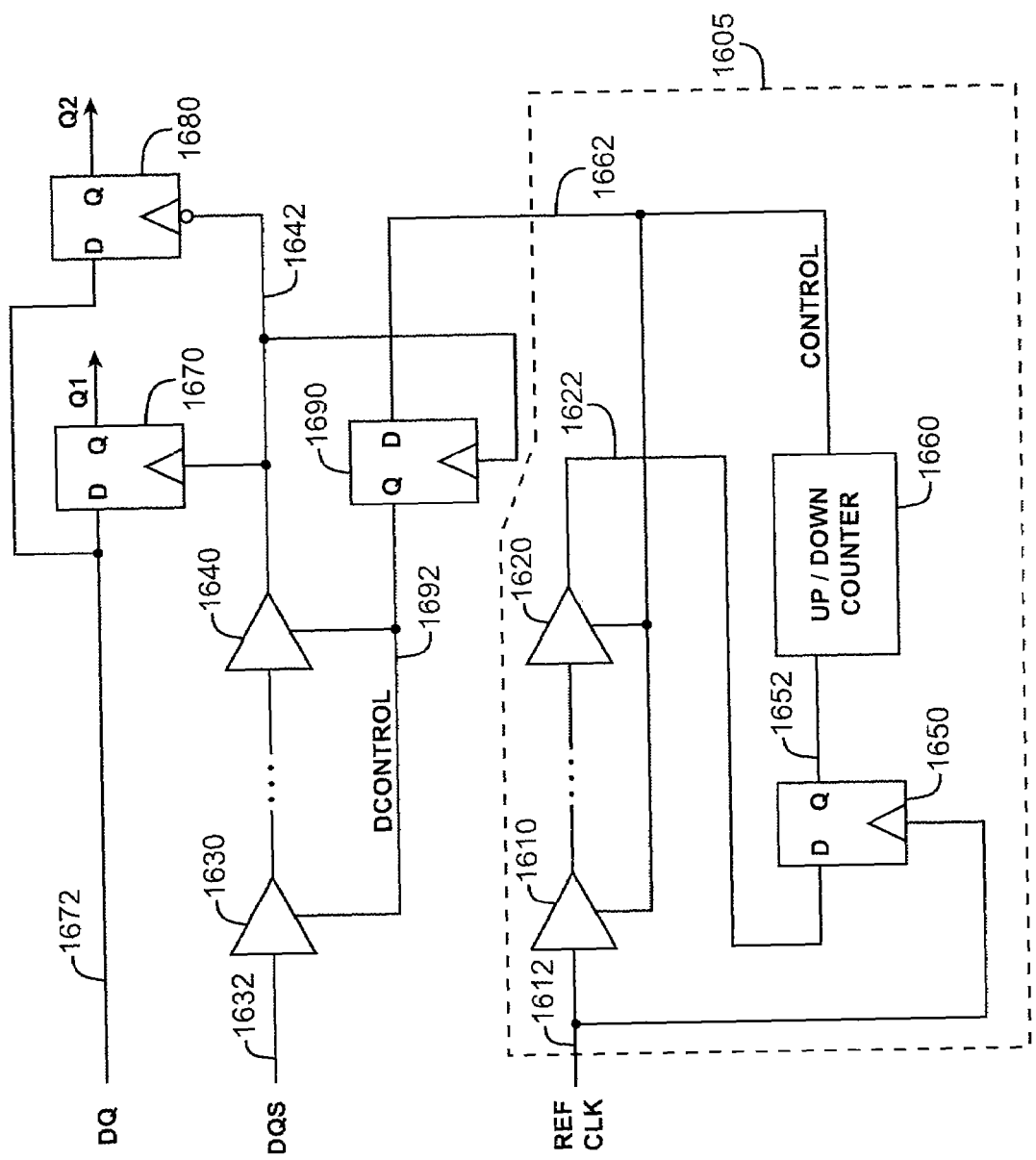
FIG. 16 is a block diagram of a multiple data-rate interface consistent with an embodiment of the present inventions that mitigates skew between control bits by retiming the control bits before they are provided to a variable delay buffer.

FIG. 16 is a block diagram of a multiple data-rate interface that mitigates skew between control bits by retiming them before they are provided to a variable delay buffer 120, or similar series of delay elements or delay line. This figure, as with the other included figures, is shown for illustrative purposes only and does not limit either the possible embodiments of the present invention or the claims.

This interface includes data input registers 1670 and 1680, a variable delay buffer or delay line including a series of one or more delay elements represented as delay elements 1630 and 1640, storage elements 1690, and a control block 1605 including a delay line including one or more delay elements represented as a series of delay elements 1610 and 1620, phase (or phase/frequency) detector 1650, and up/down counter 1660.

A read strobe signal is received on line 1632 and delayed by the delay elements 1630 and 1640, which provide a delayed read strobe output on line 1642. A data signal DQ is received on line 1672 and stored on alternating edges of the delayed read strobe signal on line 1642. A reference clock is received on line 1612 by the series of delay elements 1610 and 1620 and the phase detector 1650. In other embodiments of the present invention, dividers such as the frequency dividers 706 and 760 in FIG. 7, as well as other elements, may be included, though are removed here for clarity. The phase detector 1650 compares the relative phases of the reference clock on line 1612 and an output of the series of delay elements 1610 and 1620, and provides a signal on line 1652 to the up/down counter 1660. The up/down counter provides one or more control bits on lines 1662 to the delay elements 1610 and 1620, and the storage circuit 1690.

In this way, the control circuit 1605 generates a plurality of control bits on lines 1662 that adjust the delay through the delay elements 1630 and 1640. By matching the delay through the delay elements 1630 and 1640 to a portion of the delay through the delay elements 1610 and 1620, the read strobe signal on line 1632 may be phase shifted an appropriate amount. Since the delay through the delay elements 1610 and 1620 is 360 degrees or $2\pi$ radians when the control circuit is in lock, the delay through the series of delay elements 1630 and 1640 may be scaled accordingly. Specifically, the delay through the series of the elements 1630 and 1640 is equal to 360 degrees times M divided by N, where M is the number of delay elements in the delay line 1630 and 1640, and in N is the number of delay elements and delay line 1610 and 1620, provided that each of delay elements in the two delay lines are matched.

In a specific embodiment of the present invention, the delay through the series of delay elements 1610 and 1620 is approximately four times the duration of the delay through elements 1630 and 1640. For example, the series of delay elements 1610 and 1620 may include eight delay elements, while the series of delay elements 1630 and 1640 may include two matched delay elements.

The storage elements 1690 receive the control bits on lines 1662 and retime them to the delayed read strobe signal at the output of the series of delay elements 1630 and 1640 on line 1642. The storage elements 1690 provide outputs on lines 1692 to delay elements 1630 and 1640. In this way, the delay through the series of delay elements 1630 and 1640 does not change while an edge of the read strobe signal is being delayed, rather the control bits do not change until a read strobe rising edge has passed through the series of delay elements 1630 and 1640.

This helps avoid the problem caused by skews in the timing of the control bits, as highlighted in FIG. 15, in two ways. First, any skew between the control bits on lines 1662 is reduced, and second, the control bits are not changed while an edge of the read strobe signal is being delayed. Specifically, the storage elements 1690 retime the control signals on lines 1662 to the delayed read strobe signal on line 1642, thus reducing any skew between control bits provided on lines 1692. However, there may be skew in how the delay elements 1630 and 1640 react to changes in the control bits on lines 1692. To mitigate this, the control bits on lines 1692 do not change state until a read strobe edge has passed through the series of delay elements 1630 and 1640. At that time, there are typically no edges being passed through the delay elements 1630 and 1640, so any skew in the timing between control bits on lines 1692 do not result in a change in timing of the edges of the read strobe signal on line 1642.

At startup, the storage elements 1690 may be reset, cleared, or otherwise placed in a known state. Because of this, the initial state is likely to be incorrect, and it is not updated until a rising edge is seen on line 1642. This causes a delay in the updating of the control bits on line 1692 that can cause an error in the delay through the delay line formed by delay elements 1630 and 1640.

Figure 17:
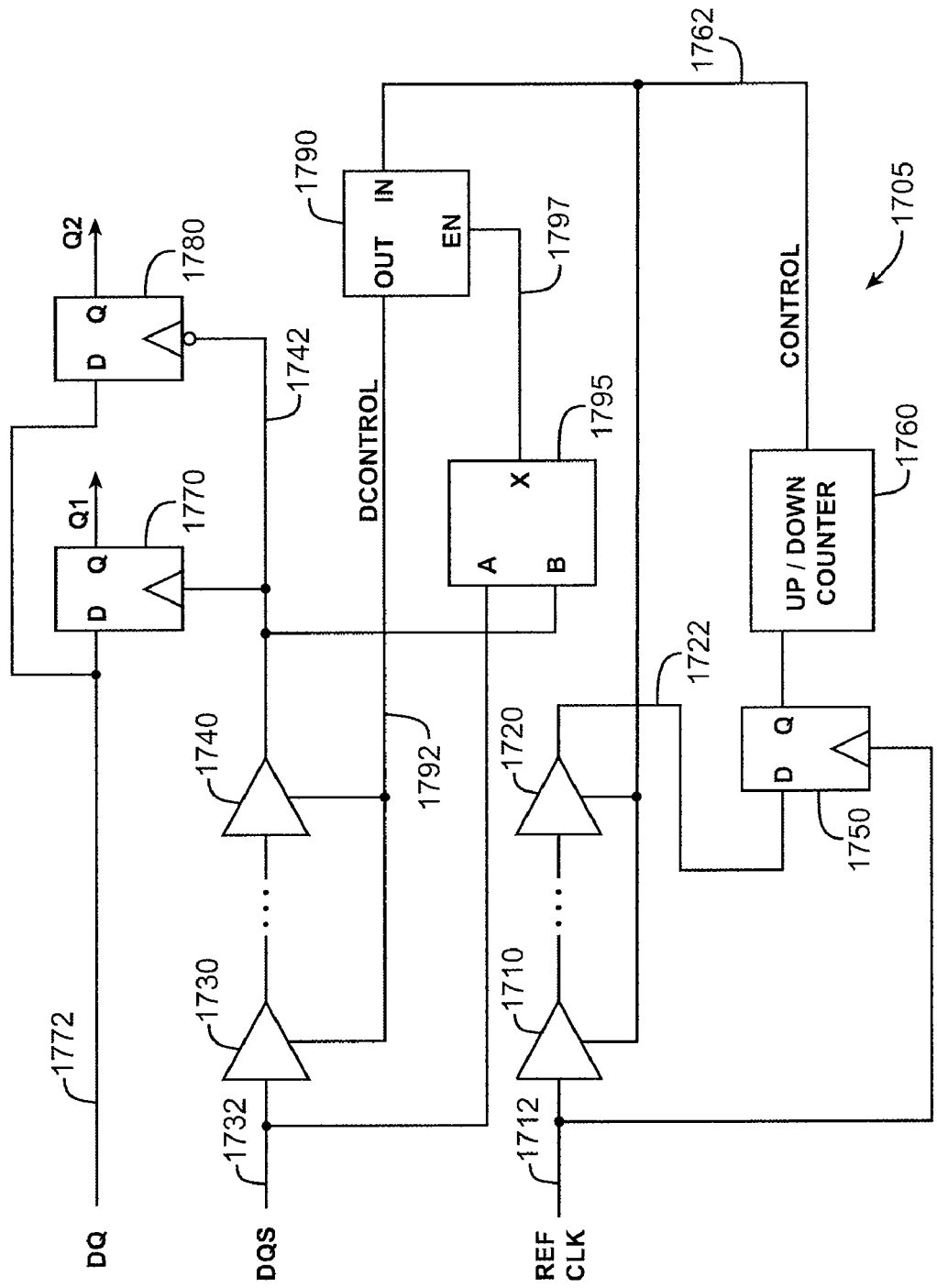
FIG. 17 is a block diagram of delay multiple data rate interface consistent with an embodiment of the present invention, where control bits are updated when the read strobe delay line is not delaying an edge of the read strobe signal.

FIG. 17 of it is a block diagram of delay multiple data-rate interface consistent with an embodiment of the present invention where control bits are updated when the read strobe delay line is not delaying an edge of the read strobe signal. This interface includes data input registers 1770 and 1780, a variable delay buffer or delay line including a series of one or more delay elements represented as delay elements 1730 and 1740, storage elements 1790, logic element 1795, and a control block 1705 including a delay line including one or more delay elements represented as a series of delay elements 1710 and 1720, phase (or phase/frequency) detector 1750, and up/down counter 1760.

A read strobe signal is received on line 1732 and delayed by the delay elements 1730 and 1740, which provide a delayed read strobe output on line 1742. A data signal DQ is received on line 1772 and stored on alternating edges of the delayed read strobe signal on line 1742. A reference clock is received on line 1712 by the series of delay elements 1710 and 1720 and the phase detector 1750. The phase detector 1750 compares the relative phases of the reference clock on line 1712 and an output of the series of delay elements 1710 and 1720, and provides a signal on line 1752 to the up/down counter 1760. The up/down counter provides one or more control bits on lines 1762 to the delay elements 1710 and 1720, and the storage circuit 1790.

The logic element 1795 receives the data strobe signal DQS on line 1732 and the output of the series of delay elements 1730 and 1740 on line 1742, and when they are in the same state (both high or both low), provides an active signal on line 1797 to the storage elements 1790. When the storage elements 1790 receive an active enable signal on line 1797, the control bits at their inputs on lines 1762 are provided at their outputs on lines 1792 to the series of delay elements 1730 and 1740. In this way, the control bits on lines 1792 may be updated when there are no active edges passing through the series of delay elements 1730 and 1740.

As before, this helps avoid the problem caused by skews in the timing of the control bits, as highlighted in FIG. 15, in two ways. First, any skew between the control bits on lines 1762 is reduced, and second, the control bits are not changed while an edge of the read strobe signal is being delayed. Specifically, the storage elements 1790 retime the control signals on lines 1762 to the delayed read strobe signal on line 1742, thus reducing any skew between control bits provided on lines 1792. Again, there may be skew in how the delay elements 1730 and 1740 react to changes in the control bits on lines 1792. To mitigate this, the control bits on lines 1792 do not change state while a read strobe edge is passing through the series of delay elements 1730 and 1740. This arrangement also provides a benefit that on startup that a clock edge is not needed to update the control bits provided to the series of delay elements 1730 and 1740.

Under some circumstances, for example were the total delay through the delay elements 1730 and 1740 is more than 180 degrees, both a rising edge and falling edge of the read strobe signal DQS on line 1732 may be passing through the series of delay elements 1730 and 1740 simultaneously. In this case, both the input signal DQS on line 1732 and the output of the series of delay elements 1730 and 1740 on line 1742 may be in the same state. To avoid changes in the control bits on lines 1792 at this time, additional logic elements 1795 may be coupled to intermediate points in the series of delay elements 1730 and 1740. The output of these logic gates may then be ORed together to provide the enable line on line 1797.

Figure 18:
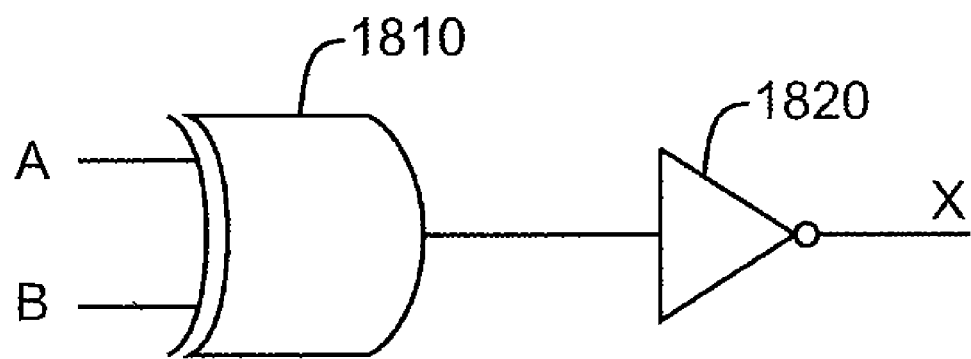
FIG. 18 is a schematic of a logic element that may be used as the logic element in FIG. 17.

FIG. 18 is a schematic of a logic element that may be used as the logic element 1795 in FIG. 17. This logic circuit includes two logic gates, specifically, an exclusive-OR gate 1810 and inverter 1820. It will appreciated by one skilled in the art that these gates may be replaced by an exclusive NOR gate, and that other gates, such as combinations of AND and OR gates may be used to implement this function. It will also be appreciated by one skilled in the art that the inverter 1820 may be optional, or that other inverters may need to be added to provide the correct polarity needed by surrounding circuitry.

Figure 19:
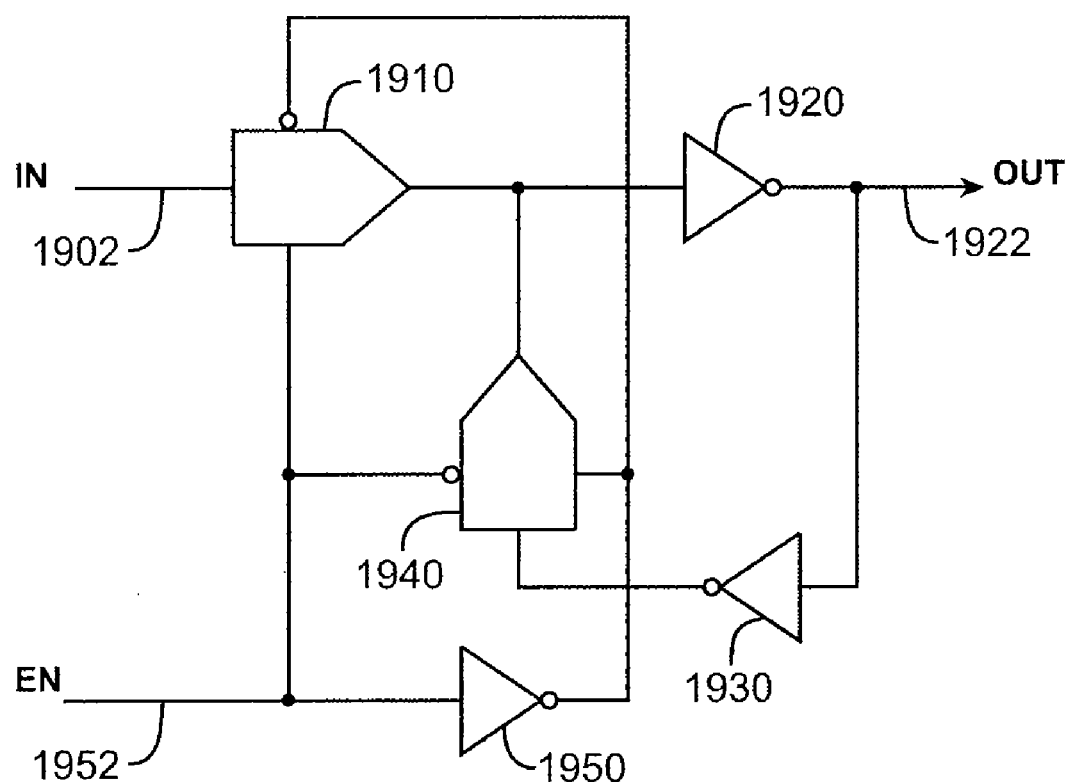
FIG. 19 is a schematic of a storage element that may be used as one of the storage elements in FIG. 17.

FIG. 19 is a schematic of a storage element that may be used as one of the storage elements 1790 in FIG. 17. This storage element includes pass gates 1910 and 1940, and inverters 1920, 1930, and 1950. This storage elements has two modes of operation, a pass mode and a latched mode. When the enable signal EN on line 1952 is high, pass gate 1910 passes the input signal IN on line 1902 to the inverter 1920, which provides an output OUT on line 1922. In the latched mode, the enable signal EN on line 1952 is low. In this mode, pass gate 1940 passes the output of inverter 1930 to the input of inverter 1920, thus forming a latch and retaining the data at the output OUT on line 1922.

Figure 20:
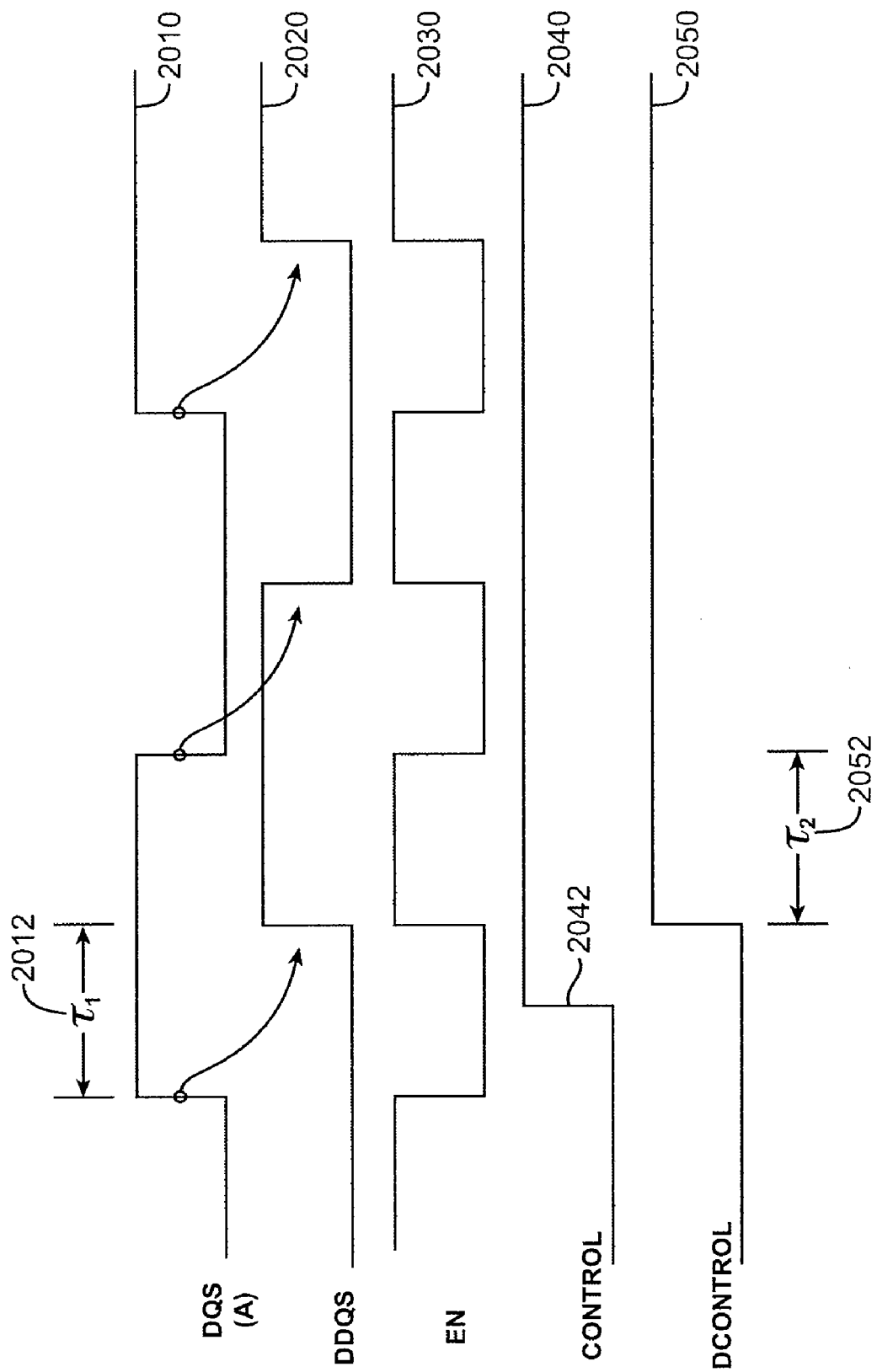
FIG. 20 is a timing diagram illustrating the operation of the logic element and storage element in FIG. 17.

FIG. 20 is a timing diagram illustrating the operation of the logic element 1795 and storage element 1790 in FIG. 17. This timing diagrams includes a read strobe signal DQS 2010, delayed read strobe signal DDQS 2020, a resulting enable signal EN 2030, a control signal CONTROL 2040 and resulting retimed control signal DCONTROL 2050.

The DQS signal 2010 is delayed, for example by a delay line or series of delay elements, resulting in a delayed read strobe signal DDQS 2020. These signals are inputs to an exclusive OR gate, or other logic function gate, which provides an enable signal EN 2030. When active, in this case high, the enable signal EN 2030 allows the control signal CONTROL 2040 to be passed and latched as the retimed control signal DCONTROL 2050. That is, during time T2 2052, changes in the control signal CONTROL 2040 do not appear as changes in DCONTROL 2050. Thus, when a control signal CONTROL change, as shown by rising edge 2042, occurs during time T1 2012, the DCONTROL signal 2050 is delayed until the delayed read strobe signal DDQS is output by the delay line or series of delay elements.

As discussed above, the relative durations—really the number of delay elements—of the delay line or series of delay elements in the control block and in the read strobe signal path set the phase shift of the read strobe signal. That is, the values of M and N determine the phase shift for the read strobe signal as discussed above. The following table lists the phase shift for different values of M and N:

TABLE 1

Read strobe phase shift as a function of delay line lengths.

| M | N | Phase_Shift |
|---|---|---|
| 2 | 8 | 90 |
| 2 | 9 | 80 |
| 2 | 10 | 72 |
| 2 | 11 | 65 |
| 2 | 12 | 60 |
| 1 | 8 | 45 |
| 1 | 9 | 40 |
| 1 | 10 | 36 |
| 1 | 11 | 33 |
| 1 | 12 | 30 |

It is often desirable to be able to tune or adjust this phase delay. For example, a change in delay may be used to correct mismatches in trace lengths on printed circuit boards, or to compensate for input register set-up and hold times. Accordingly, some embodiments of the present invention provide delay lines or series of delay elements having a variable length.

Figure 21:
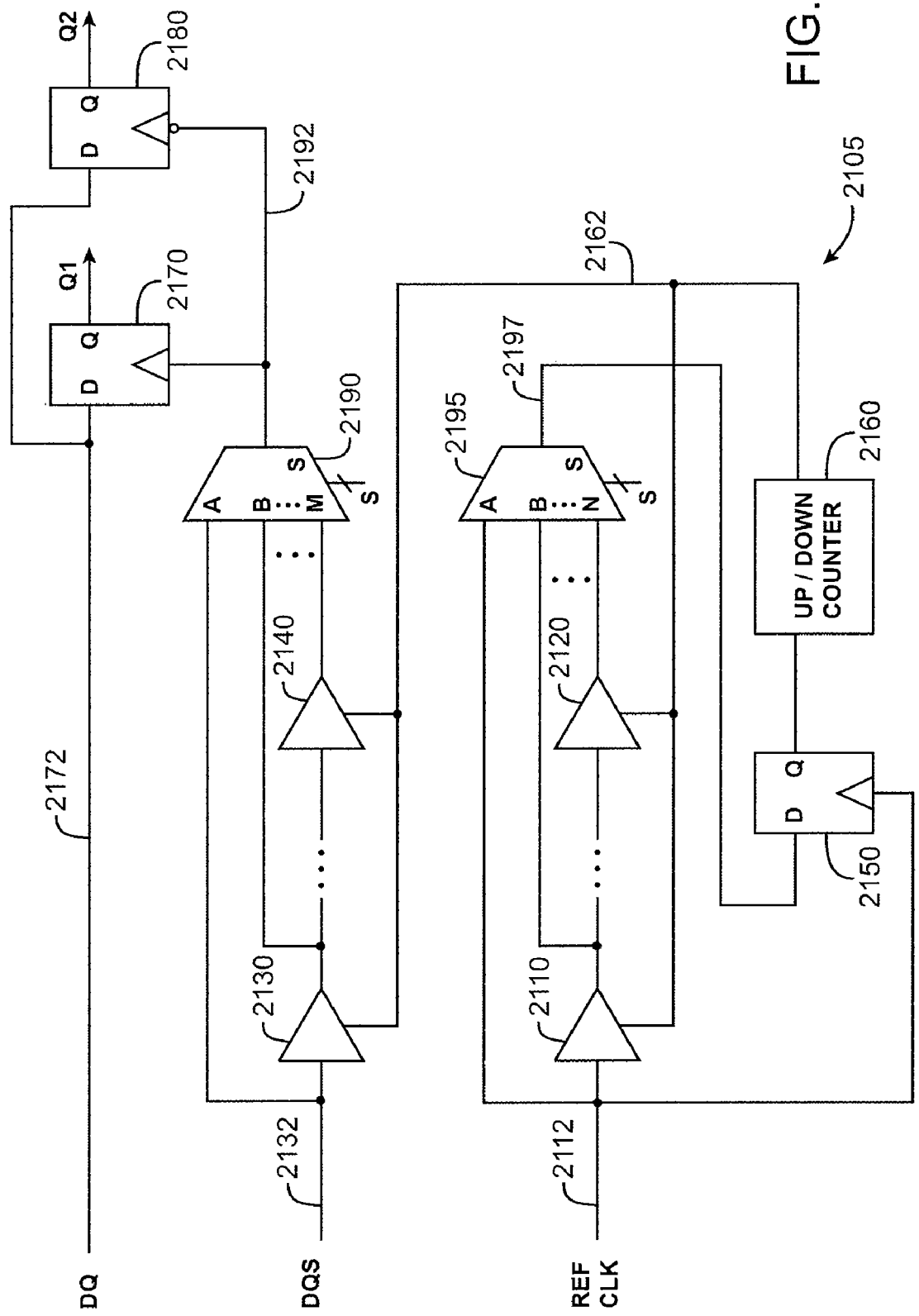
FIG. 21 is a schematic of a multiple data-rate interface in accordance with an embodiment of the present invention having variable length delay lines.

FIG. 21 is a schematic of a multiple data-rate interface, in accordance with an embodiment of the present invention having variable length delay lines. This interface includes data input registers 2170 and 2180, a variable delay buffer or delay line including a series of one or more delay elements represented as delay elements 2130 and 2140 and multiplexer 2190, and a control block 2105 including a delay line including one or more delay elements represented as a series of delay elements 2110 and 2120 and multiplexer 2195, phase (or phase/frequency) detector 2150, and up/down counter 2160.

A read strobe signal is received on line 2132 and delayed by the delay elements 2130 and 2140, which provide a delayed read strobe output on line 2142. A data signal DQ is received on line 2172 and stored on alternating edges of the delayed read strobe signal on line 2142. A reference clock is received on line 2112 by the series of delay elements 2110 and 2120 and the phase detector 2150. The phase detector 2150 compares the relative phases of the reference clock on line 2112 and an output of the series of delay elements 2110 and 2120, and provides a signal on line 2152 to the up/down counter 2160. The up/down counter 2160 provides one or more control bits on lines 2162 to the delay elements 2110, 2120, 2130, and 2140. In various embodiments of the present invention, storage elements may be inserted between the up/down counter 2160 and the delay elements 2130 and 2140, such elements have been omitted here for clarity.

Each of the delay lines or series of delay elements may be adjusted by selecting from among the inputs of the multiplexers 2190 and 2195. Specifically, the length of the delay line or series of delay elements 2110 and 2120 may be adjusted by selecting from among the inputs of multiplexer 2195. For example, the B input may be chosen, thus limiting the length of the delay line to one element. In this particular example, a zero length may be chosen by selecting the A input, though in practical circuits this may not be a useful option, and may be omitted. Similarly, the read strobe delay line may be adjusted in length by selecting from among the inputs of the multiplexer 2190. These multiplexers may be actual multiplexers, combinations of logic gates, or other appropriate selection circuitry.

The selection of these multiplexer inputs may be made by configuration bits stored in fuses or memories, they may be provided by logic circuits, or they may be provided by other circuits or methods.

Figure 22:
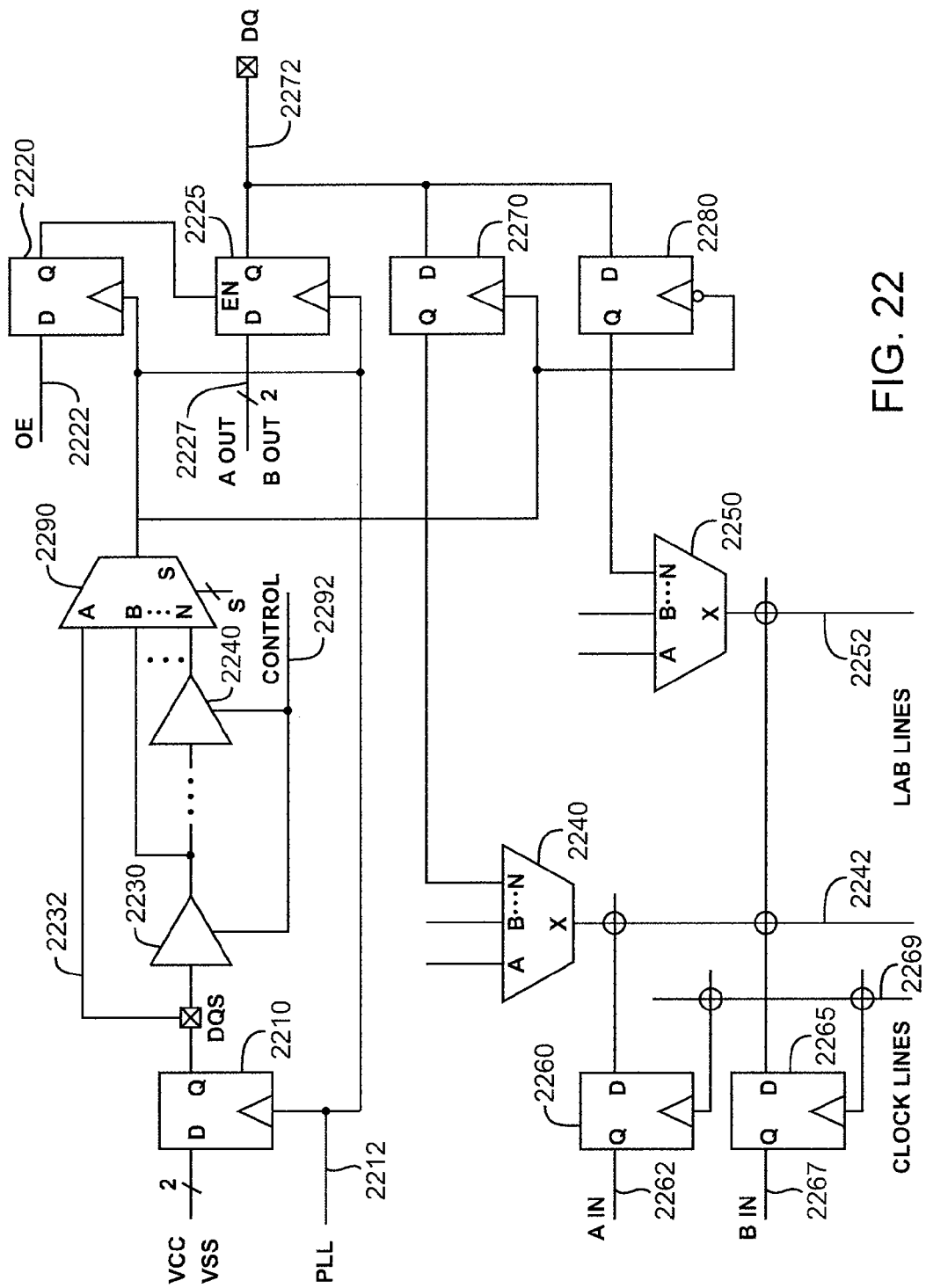
FIG. 22 is a block diagram of a portion of an input/output circuit consistent with an embodiment of the present invention.

FIG. 22 is a block diagram of a portion of an input/output circuit consistent with an embodiment of the present invention. This portion of input/output circuitry includes a frequency doubler 2210, a delay line or series of delay elements represented as delay elements 2230 and 2240, multiplexer 2290, output enable register 2220, output register 2225, input registers 2270 and 2280, multiplexers 2240 and 2250, and input registers 2260 and 2265.

A clock or synchronizing signal PLL from a phase-locked loop is received on line 2212 by the frequency doubler 2210. The frequency doubler 2210 is a double register having one input tied to VCC and the other to VSS. This frequency doubler generates a read strobe signal DQS on line 2232, which is delayed by the delay line or series of delay elements 2230 and 2240. The multiplexer 2290 selects from among at least some of the inputs and outputs of these delay elements and provides a delayed read strobe signal to the input registers 2270 and 2280.

Input data is received on line DQ 2272 by the input registers 2270 and 2280. This data is latched on alternating clocks provided by the multiplexer 2290. The latched data is provided to multiplexers 2240 and 2250. These multiplexers drive a plurality of logic array block lines 2242 and 2252, which are selectively connected to input registers 2260 and 2265. Registers 2260 and 2265 are clocked by clock signals on local clock lines 2269.

The PLL signal on line 2212 also clocks an output register 2225, which is enabled by output enable register 2220.

Figure 23:
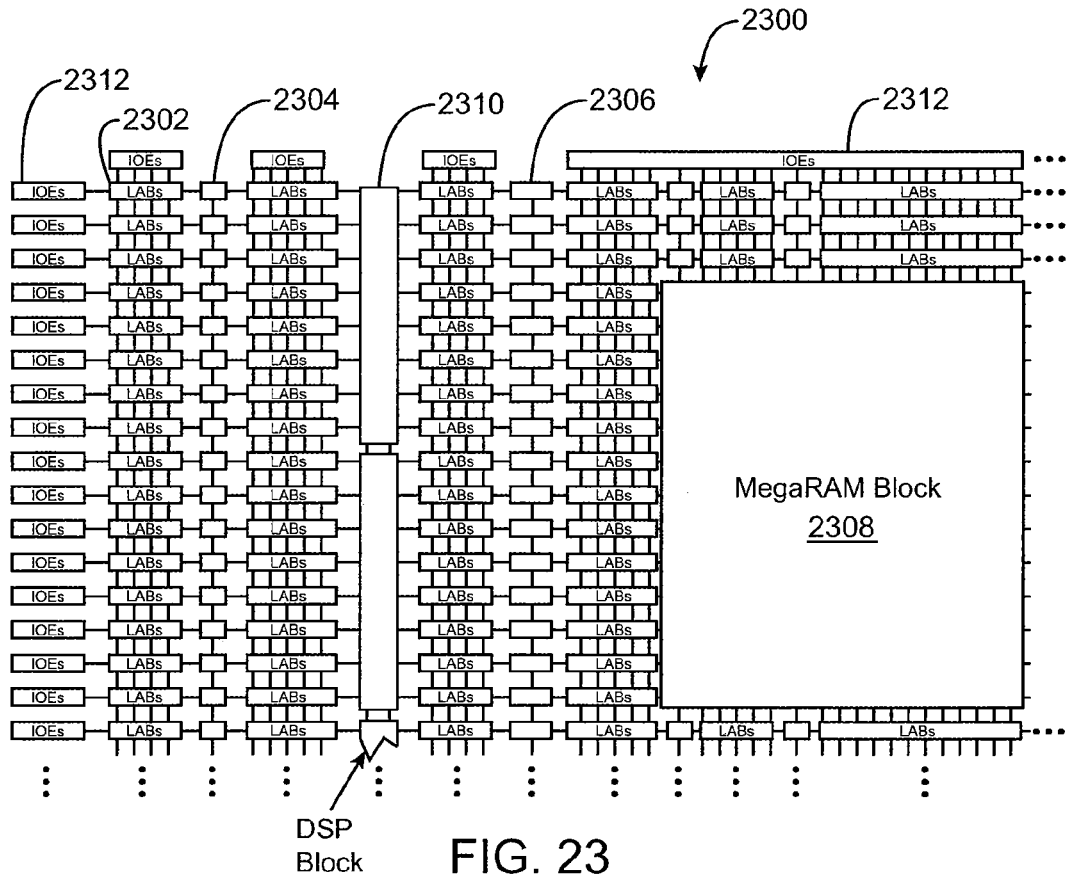
FIG. 23 is a simplified block diagram of a programmable logic device that can implement embodiments of the present invention.

FIG. 23 is a simplified partial block diagram of an exemplary high-density programmable logic device 2300 wherein techniques according to the present invention can be utilized. PLD 2300 includes a two-dimensional array of programmable logic array blocks (or LABs) 2302 that are interconnected by a network of column and row interconnects of varying length and speed. LABs 2302 include multiple (e.g., 10) logic elements (or LEs), an LE being a small unit of logic that provides for efficient implementation of user defined logic functions.

PLD 2300 also includes a distributed memory structure including RAM blocks of varying sizes provided throughout the array. The RAM blocks include, for example, 512 bit blocks 2304, 4K blocks 2306 and a M-Block 2308 providing 512K bits of RAM. These memory blocks may also include shift registers and FIFO buffers. PLD 2300 further includes digital signal processing (DSP) blocks 2310 that can implement, for example, multipliers with add or subtract features. I/O elements (IOEs) 2312 located, in this example, around the periphery of the device support numerous single-ended and differential I/O standards. It is to be understood that PLD 2300 is described herein for illustrative purposes only and that the present invention can be implemented in many different types of PLDs, FPGAs, and the like.

Figure 24:
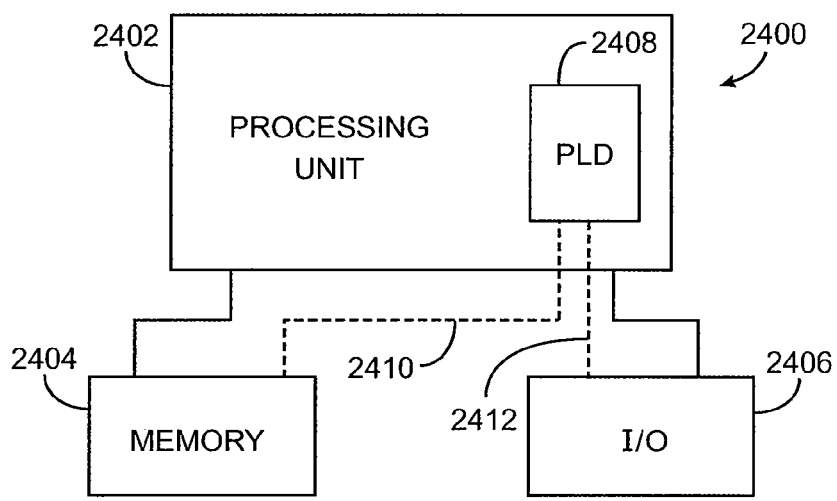
FIG. 24 is a block diagram of an electronic system that may incorporate embodiments of the present invention.

While PLDs of the type shown in FIG. 23 provide many of the resources required to implement system level solutions, the present invention can also benefit systems wherein a PLD is one of several components. FIG. 24 shows a block diagram of an exemplary digital system 2400, within which the present invention may be embodied. System 2400 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 2400 may be provided on a single board, on multiple boards, or within multiple enclosures.

System 2400 includes a processing unit 2402, a memory unit 2404 and an I/O unit 2406 interconnected together by one or more buses. According to this exemplary embodiment, a programmable logic device (PLD) 2408 is embedded in processing unit 2402. PLD 2408 may serve many different purposes within the system in FIG. 24. PLD 2408 can, for example, be a logical building block of processing unit 2402, supporting its internal and external operations. PLD 2408 is programmed to implement the logical functions necessary to carry on its particular role in system operation. PLD 2408 may be specially coupled to memory 2404 through connection 2410 and to I/O unit 2406 through connection 2412.

Processing unit 2402 may direct data to an appropriate system component for processing or storage, execute a program stored in memory 2404 or receive and transmit data via I/O unit 2406, or other similar function. Processing unit 2402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 2408 can control the logical operations of the system. In an embodiment, PLD 2408 acts as a reconfigurable processor, which can be reprogrammed as needed to handle a particular computing task. Alternately, programmable logic device 2408 may itself include an embedded microprocessor. Memory unit 2404 may be a random access memory (RAM), read only memory (ROM), fixed or flexible disk media, PC Card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a control block comprising:
   a first series of delay elements coupled to a reference clock input;

a phase detector coupled to the reference clock input and an output of the first series of delay elements; and a counter having an input coupled to an output of the phase detector and an output coupled to control inputs of the first series of delay elements;

a storage circuit having an input coupled to the output of the counter; and a delay circuit having a control input coupled to an output of the storage circuit, wherein the delay circuit comprises a series of delay elements, each having an input and an output, and wherein the storage circuit comprises a logic gate coupled to an input of a delay element in the delay circuit and an output of a delay element in the delay circuit, and further coupled to a latch, the latch coupled between the counter in the control circuit and the delay circuit.

2. The integrated circuit of claim 1 wherein the storage circuit comprises a plurality of flip-flops having an input coupled to the counter in the control block, an output coupled to the delay circuit, and a clock input coupled to an output of the delay circuit.

3. The integrated circuit of claim 1 wherein the storage circuit comprises:

a logic gate coupled to an input and the output of the delay circuit, and further coupled to a latch, the latch coupled between the counter in the control circuit and the delay circuit.

4. The integrated circuit of claim 1 wherein the logic gate is an exclusive-OR gate.

5. The integrated circuit of claim 1 wherein the delay circuit is a delay element.

6. The integrated circuit of claim 5 further comprising:

a first register having a clock input coupled to the output of the delay circuit; and a second register having a complementary clock input coupled to the output of the delay circuit.

7. The integrated circuit of claim 6 wherein the first register has a first input and the second register has a second input, and the first and second inputs are coupled to a data input.

8. The integrated circuit of claim 7 wherein the integrated circuit is a field programmable gate array.

9. An integrated circuit comprising:

a control circuit to receive a reference clock and provide a plurality of control bits, wherein the control circuit comprises:

a first series of delay elements to receive the reference clock;

a phase detector to compare the phases of the reference clock and an output of the first series of delay elements and provide an output signal; and a counter to receive the phase detector output signal and provide the control bits;

a storage circuit coupled to receive and store the plurality of control bits, and further to provide the plurality of stored control bits;

a delay element to receive the plurality of stored control bits, and to provide a clock signal to the storage circuit; and a second series of delay elements including the delay element, each delay element in the second series of delay elements having an input, wherein the storage circuit comprises a logic gate to receive a signal from an input of a delay element in the second series of delay elements and an output of the second series of delay elements, and further to provide an output to a plurality of latches, each latch to receive and store one of the plurality of control bits, and further to provide the stored one of the plurality of control bits to the delay element.

10. The integrated circuit of claim 9 wherein a polarity of the phase detector output depends on the relative phase of the reference clock and the output of the first series of delay elements, and the counter is an up-down counter that counts up when the phase detector output has a first polarity, and counts down when the phase detector output has a second polarity.

11. The integrated circuit of claim 9 wherein the logic gate comprises an exclusive-OR gate.

12. The integrated circuit of claim 9 wherein the storage circuit comprises a plurality of flip-flops, each flip-flop having an input to receive and store one of the plurality of control bits, and further to provide the stored one of the plurality of control bits to the delay element.

13. The integrated circuit of claim 12 wherein each of the plurality of flip-flops in the storage circuit has a clock input to receive the output of the delay element.

14. The integrated circuit of claim 9 wherein the control circuit is a delay-locked loop.

15. A method of delaying a data strobe signal comprising:

receiving a reference clock signal;

delaying the reference clock signal a first duration, the first duration dependent on a plurality of control signals;

comparing the phase of the reference clock signal and the delayed reference clock signal to generate the plurality of control signals;

storing the plurality of control signals;

receiving a data strobe signal; and delaying the data strobe signal a second duration, the second duration dependent on the plurality of stored control signals, wherein the control signals are not stored while the data strobe signal is delayed, and wherein the plurality of control signals are stored when an edge of the data strobe signal is not being delayed.

16. The method of claim 15 wherein the plurality of control signals are stored when the received data strobe signal has been delayed the second duration.

* * * * *